US012777756B2

(12) United States Patent
Kim et al.

(10) Patent No.: US 12,777,756 B2
(45) Date of Patent: Oct. 27, 2026

(54) DISPLAY DEVICE COMPRISING SEMICONDUCTOR LIGHT-EMITTING ELEMENT

(71) Applicants: LG ELECTRONICS INC., Seoul (KR); LG DISPLAY CO., LTD., Seoul (KR)

(72) Inventors: Youngdo Kim, Seoul (KR); Hyeseon Eom, Paju-si (KR); Juhyun Nam, Paju-si (KR); Hun Jang, Paju-si (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 358 days.

(21) Appl. No.: 18/290,644

(22) PCT Filed: Jul. 22, 2022

(86) PCT No.: PCT/KR2022/010779

§ 371 (c)(1),
(2) Date: Jan. 19, 2024

(87) PCT Pub. No.: WO2023/003422

PCT Pub. Date: Jan. 26, 2023

(65) Prior Publication Data

US 2024/0258480 A1 Aug. 1, 2024

(30) Foreign Application Priority Data

Jul. 22, 2021 (KR) ........................ 10-2021-0096311

(51) Int. Cl.
*H01L 21/78* (2006.01)
*H10H 20/853* (2025.01)
(Continued)

(52) U.S. Cl.
CPC ........ *H10H 20/857* (2025.01); *H10H 20/853* (2025.01); *H10W 90/00* (2026.01)

(58) Field of Classification Search
CPC .... H10H 20/857; H10H 20/853; H10H 29/03; H10H 29/37; H10H 29/49; H10H 20/01;
(Continued)

(56) References Cited

U.S. PATENT DOCUMENTS 8,987,765 B2 * 3/2015 Bibl .................. H10W 72/0198 257/691
9,171,865 B2 * 10/2015 Seo ...................... H10D 86/021
(Continued)

FOREIGN PATENT DOCUMENTS

KR 10-2017-0117282 A 10/2017
KR 10-2019-0085892 A 7/2019
(Continued)

OTHER PUBLICATIONS

International Search Report for PCT/KR2022/010779 mailed on Nov. 16, 2022.

*Primary Examiner* — Vu A Vu
(74) *Attorney, Agent, or Firm* — Birch, Stewart, Kolasch & Birch, LLP

(57) ABSTRACT

A display device according to the embodiment includes a substrate, a first assembly wiring and a second assembly wiring alternately arranged on the substrate and spaced apart from each other, a planarization layer disposed on the first assembly wiring and the second assembly wiring and having an opening and a contact portion, a light emitting device disposed inside the opening and having a first electrode overlapping the first assembly wiring and the second assembly wiring, and a pixel electrode disposed on the planarization layer and in contact with the second electrode of the light emitting device through a contact portion, and the plurality of contact units may overlap a portion of at least
(Continued)

one side of the area where the light emitting device is disposed.

19 Claims, 13 Drawing Sheets

(51) Int. Cl.
*H10H 20/857* (2025.01)
*H10W 90/00* (2026.01)

(58) Field of Classification Search
CPC . H10H 29/142; H10H 20/8506; H10W 90/00; H10D 86/441; H10D 86/451; H10D 86/60; H10D 86/00
USPC ............................................................ 257/91
See application file for complete search history.

(56) References Cited

U.S. PATENT DOCUMENTS

| | | | | |
|---|---|---|---|---|
| 9,240,396 | B2 * | 1/2016 | Fan | H10W 90/00 |
| 9,401,392 | B2 * | 7/2016 | Beak | H10K 59/1216 |
| 9,985,012 | B2 * | 5/2018 | Kwon | H10W 90/00 |
| 10,325,936 | B2 * | 6/2019 | Kang | H10D 86/451 |
| 10,373,985 | B2 * | 8/2019 | Kim | H10D 86/60 |
| 10,497,685 | B2 | 12/2019 | Wang | |
| 11,011,572 | B2 * | 5/2021 | Chen | H10H 29/142 |
| 11,916,173 | B2 * | 2/2024 | Kim | H10H 20/84 |
| 12,033,987 | B2 * | 7/2024 | Watanabe | H10W 90/00 |
| 12,456,717 | B2 * | 10/2025 | Jeon | H10W 90/00 |
| 2016/0372514 | A1 * | 12/2016 | Chang | G09G 3/2003 |
| 2017/0294451 | A1 | 10/2017 | Kim et al. | |
| 2018/0122837 | A1 * | 5/2018 | Kang | H10D 86/451 |
| 2019/0181301 | A1 | 6/2019 | Kim et al. | |
| 2019/0198488 | A1 | 6/2019 | Wang | |
| 2020/0168777 | A1 | 5/2020 | Kang | |
| 2020/0365567 | A1 | 11/2020 | Park et al. | |
| 2022/0246583 | A1 | 8/2022 | Park et al. | |
| 2022/0254961 | A1 | 8/2022 | Chang et al. | |
| 2022/0367774 | A1 | 11/2022 | Kim et al. | |
| 2022/0375915 | A1 | 11/2022 | Kim et al. | |
| 2022/0415859 | A1 | 12/2022 | Choi et al. | |
| 2023/0059135 | A1 | 2/2023 | Chang et al. | |
| 2023/0064316 | A1 | 3/2023 | Park et al. | |
| 2023/0110862 | A1 | 4/2023 | Kim et al. | |

FOREIGN PATENT DOCUMENTS

| | | | |
|---|---|---|---|
| KR | 10-2019-0113695 | A | 10/2019 |
| KR | 10-2030323 | B1 | 10/2019 |
| KR | 10-2019-0143840 | A | 12/2019 |
| KR | 10-2020-0023317 | A | 3/2020 |
| KR | 10-2020-0026845 | A | 3/2020 |
| KR | 10-2020-0099037 | A | 8/2020 |
| KR | 10-2020-0106039 | A | 9/2020 |
| WO | WO 2021/033802 | A1 | 2/2021 |
| WO | WO 2021/080028 | A1 | 4/2021 |

* cited by examiner

[FIG. 1]
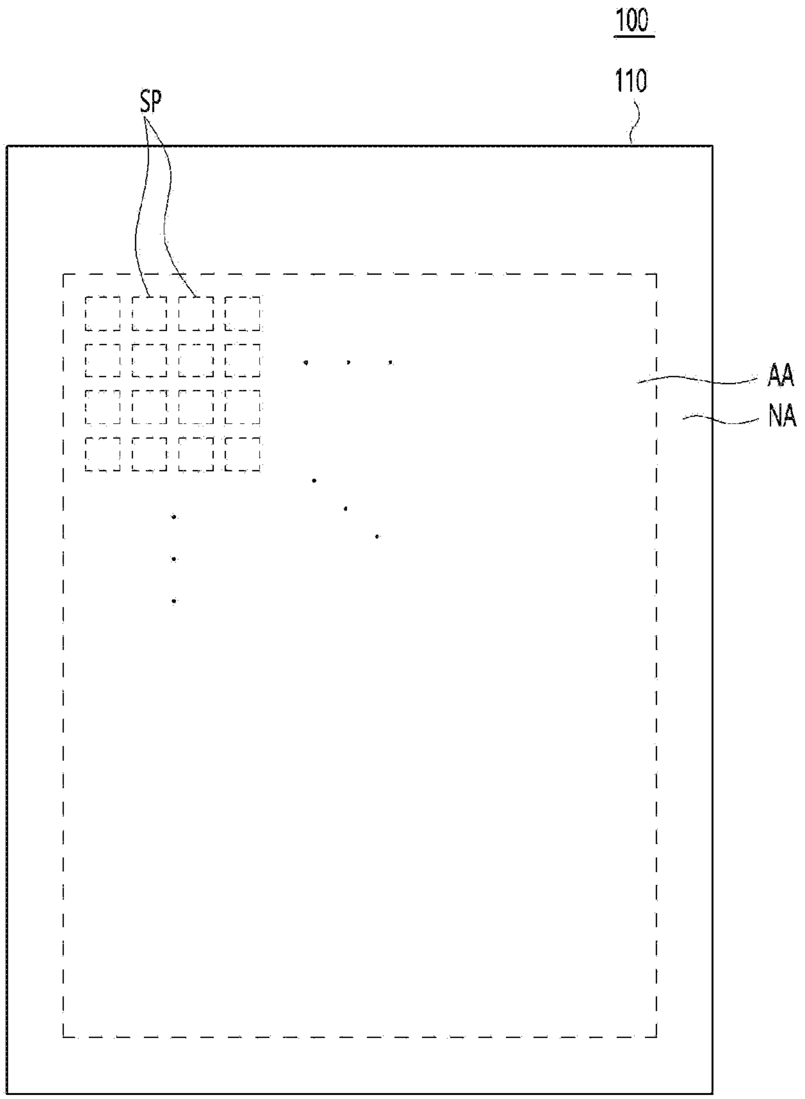

[FIG. 2]
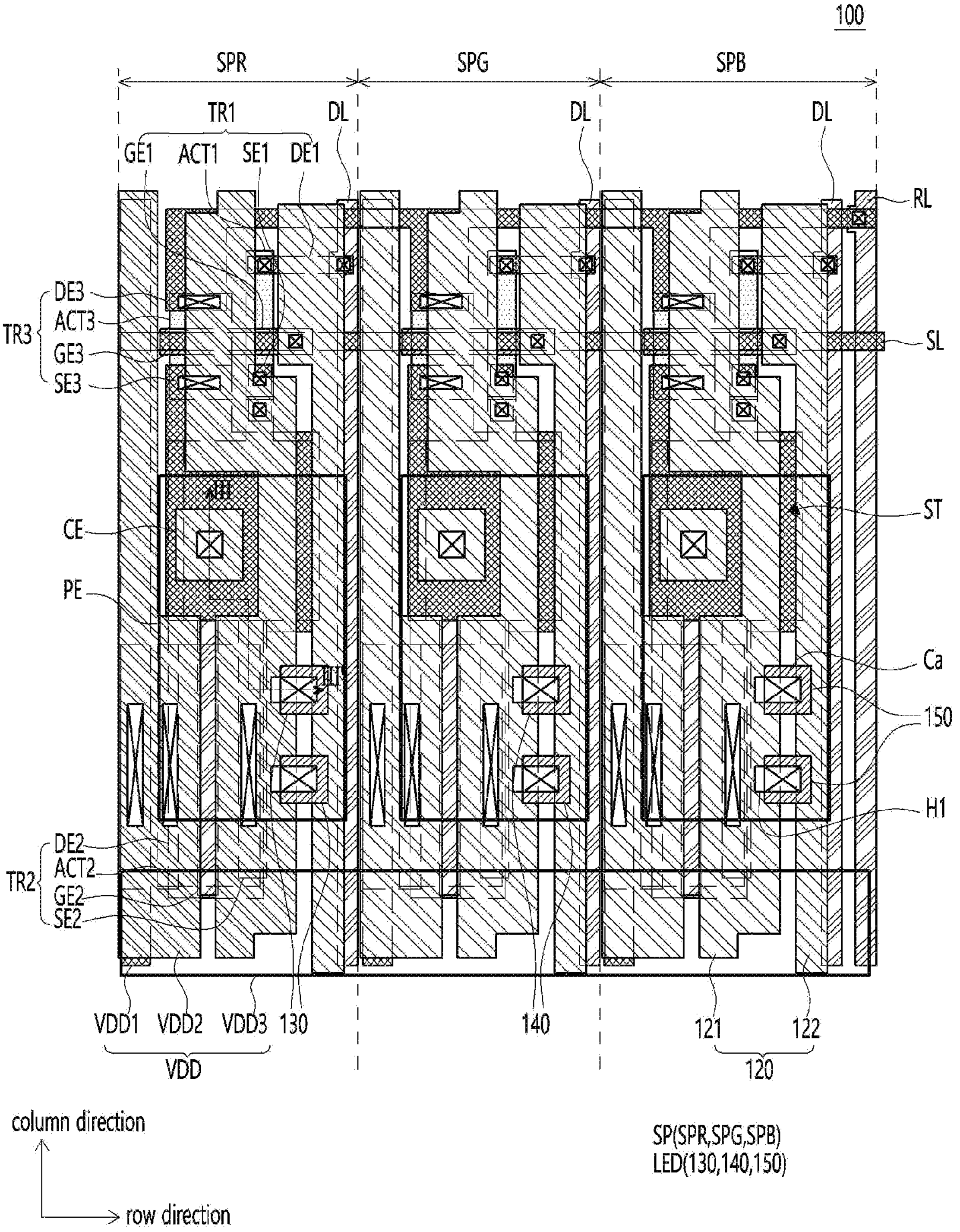

[FIG. 3]
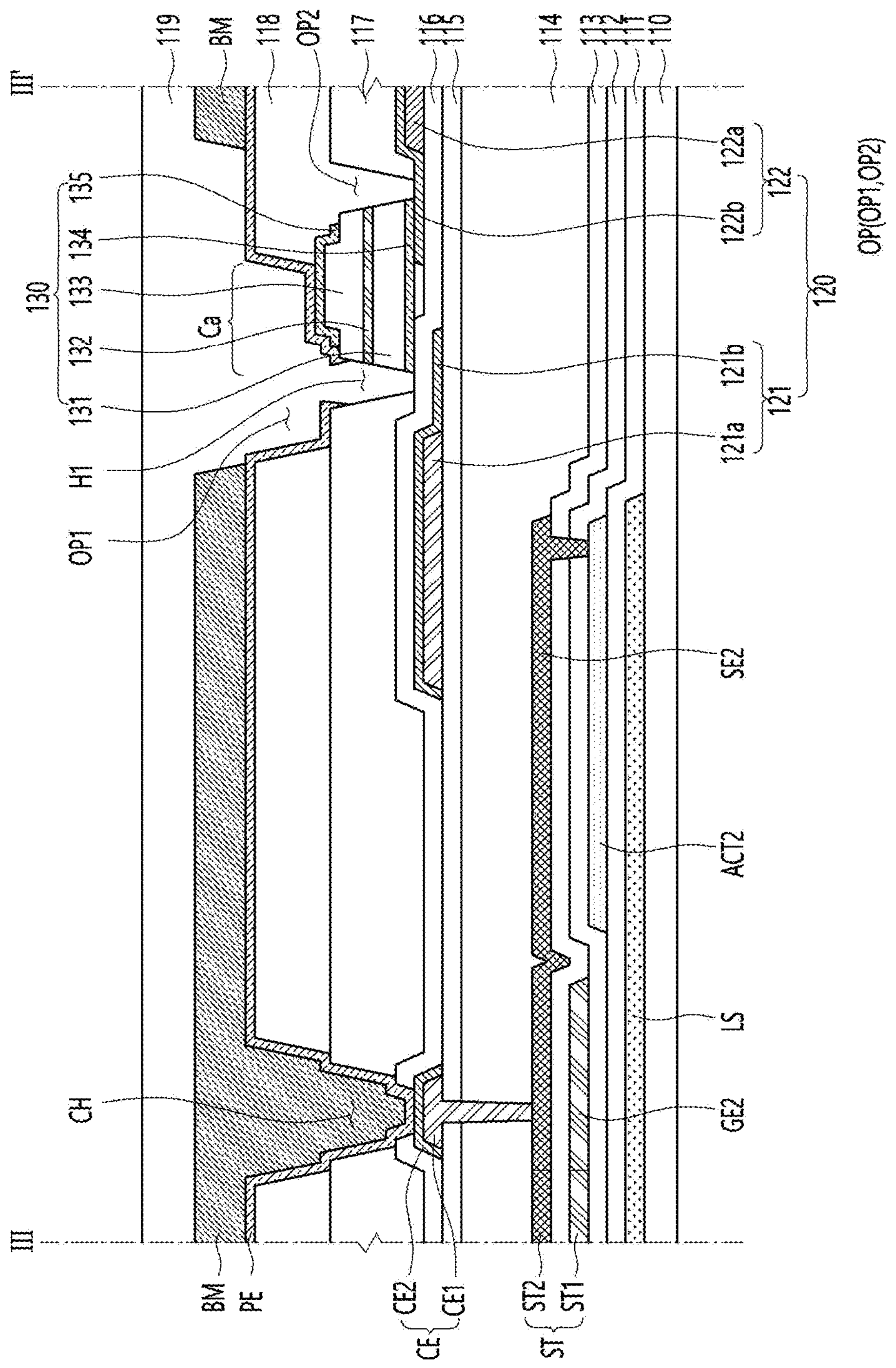

[FIG. 4a]
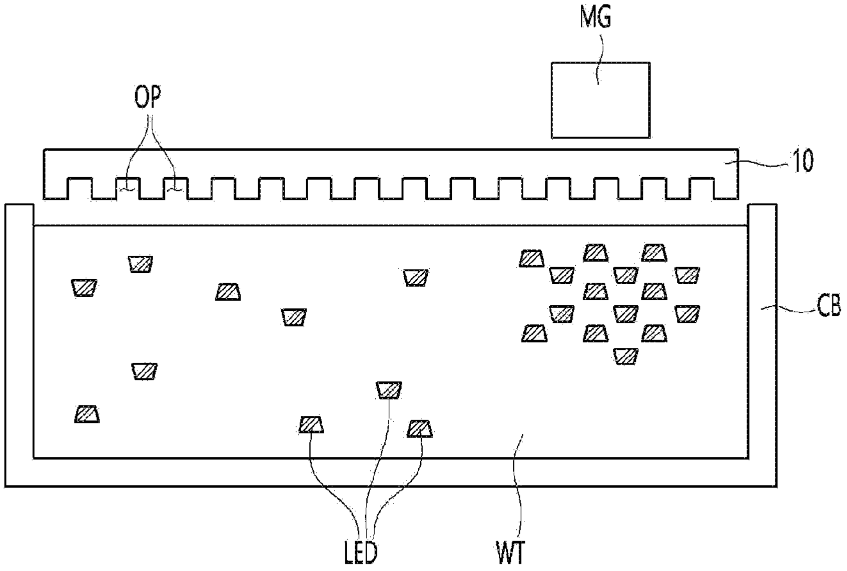

[FIG. 4b]
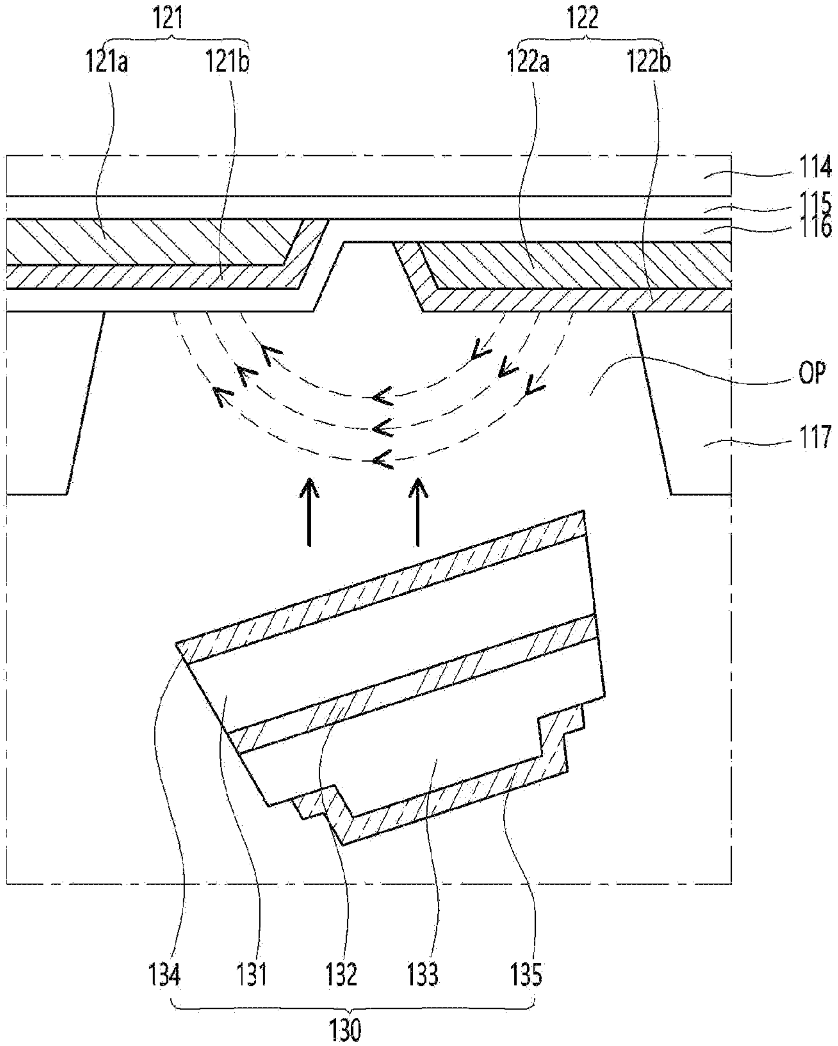

[FIG. 4c]
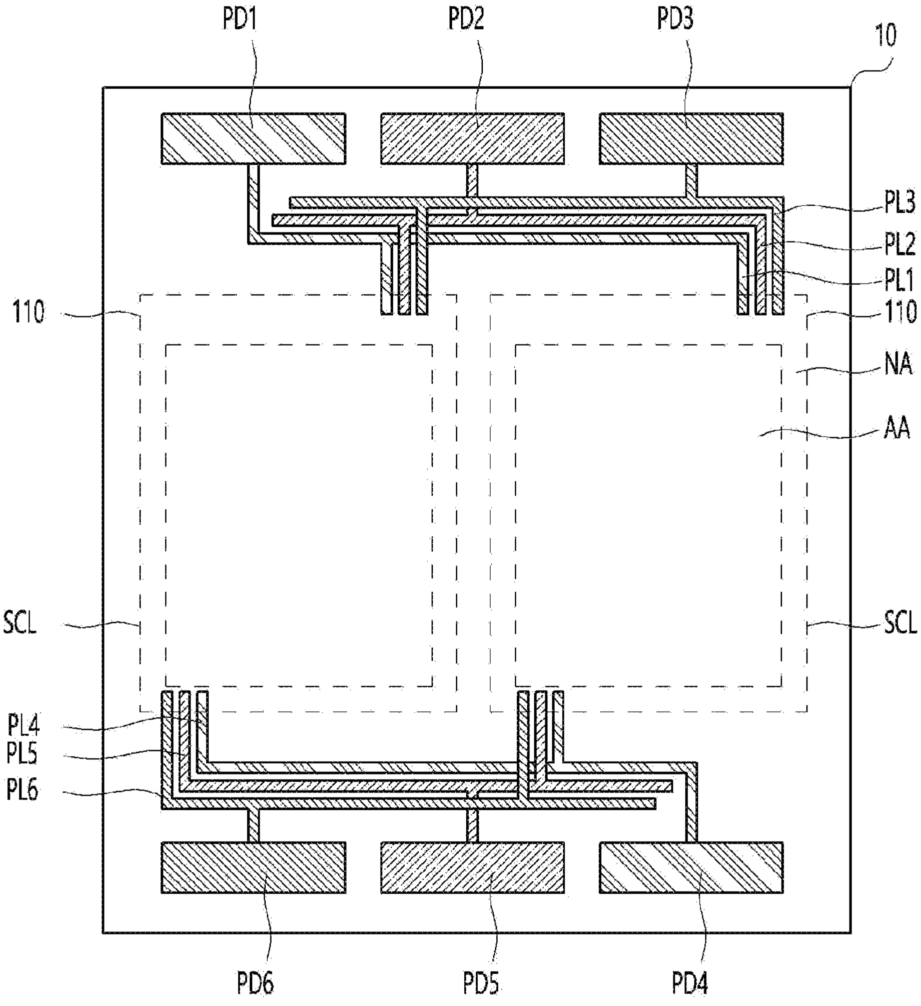
PD(PD1,PD2,PD3,PD4,PD5,PD6)
PL(PL1,PL2,PL3,PL4,PL5,PL6)

[FIG. 5]
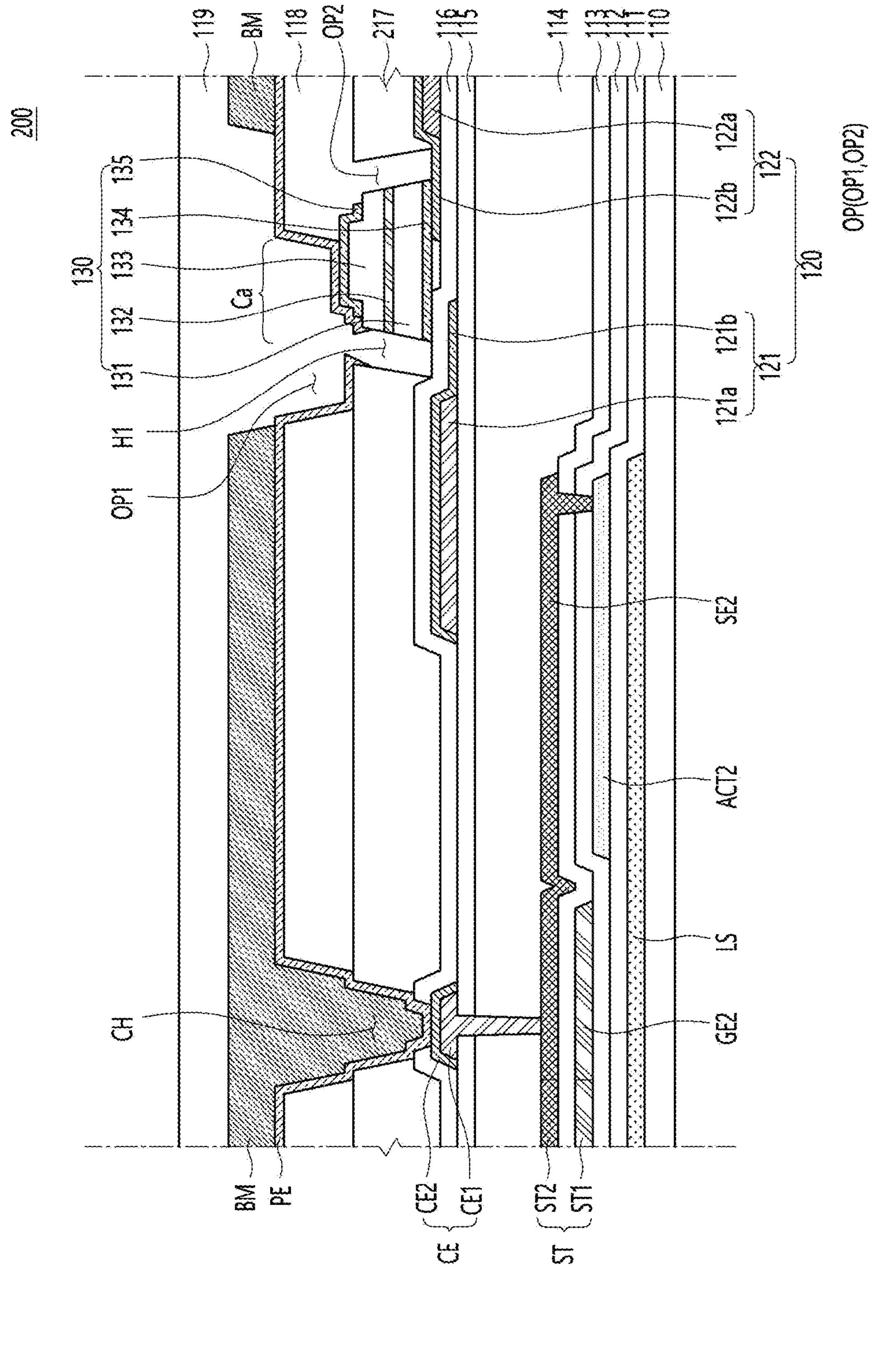

[FIG. 6]
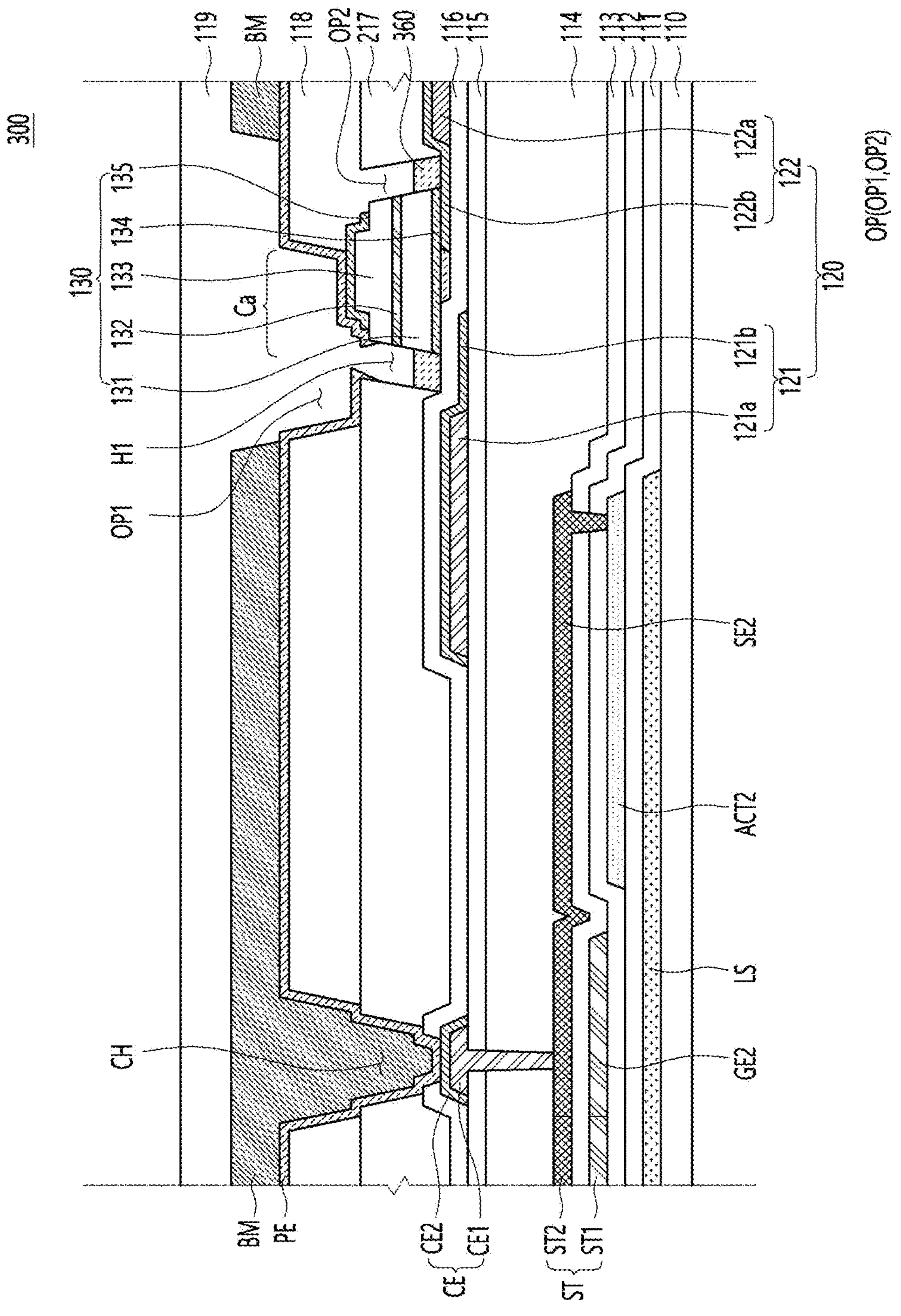

[FIG. 7]
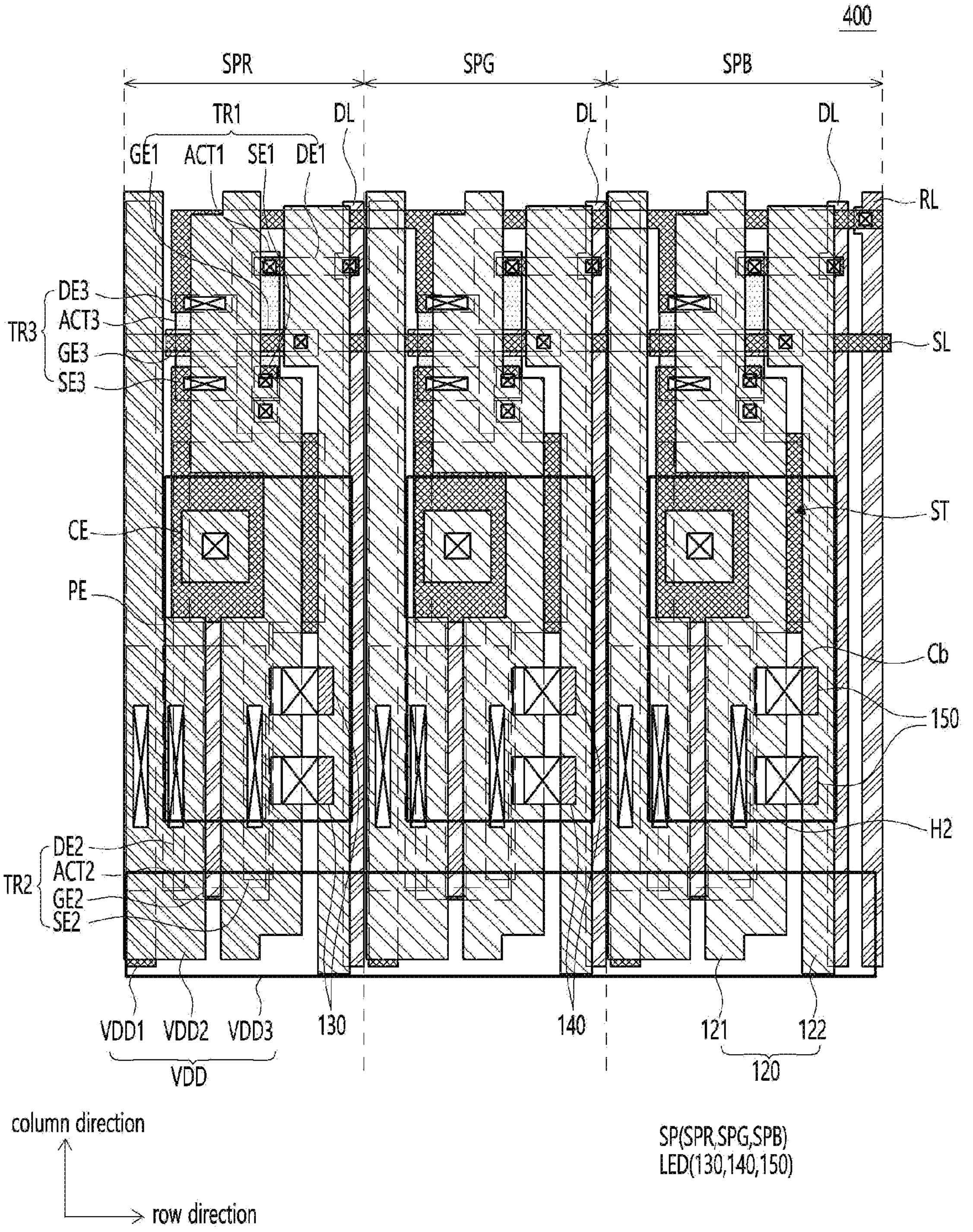

[FIG. 8]
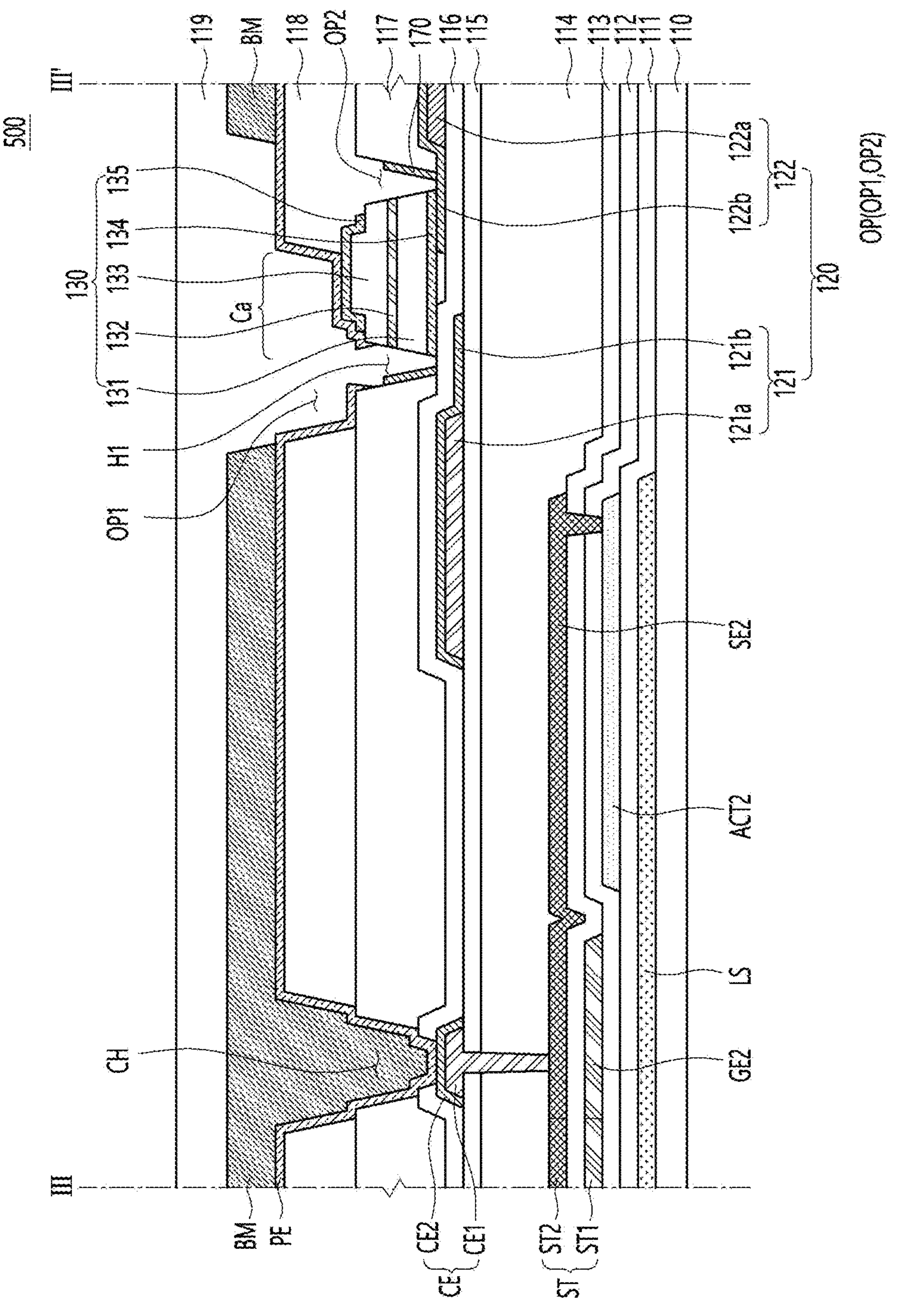

[FIG. 9]
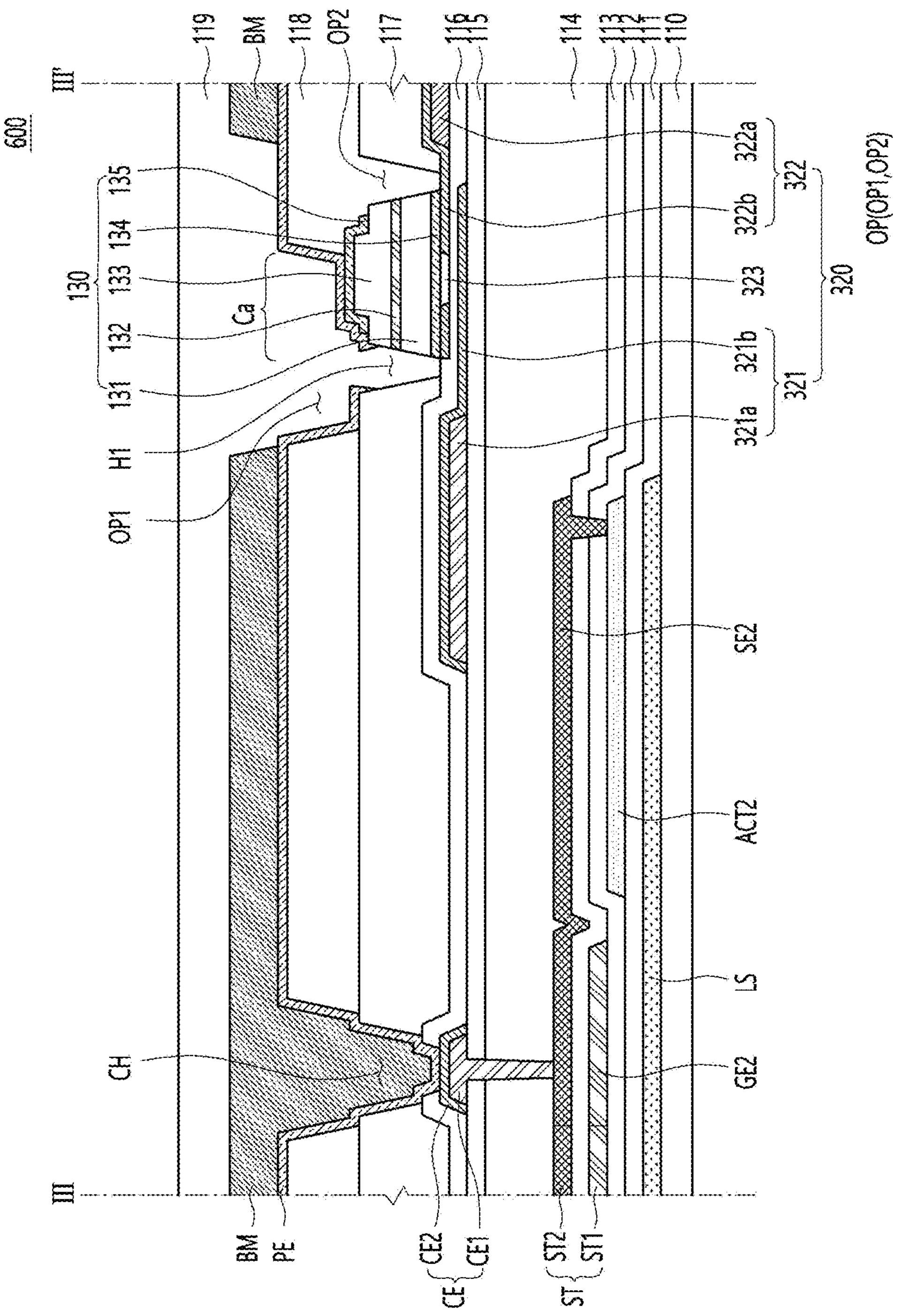

[FIG. 10]
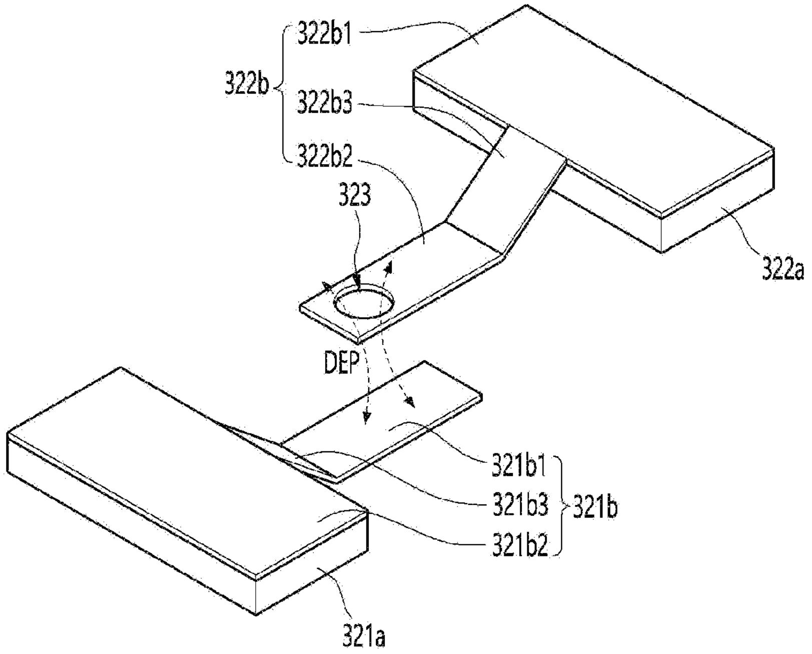

[FIG. 11]
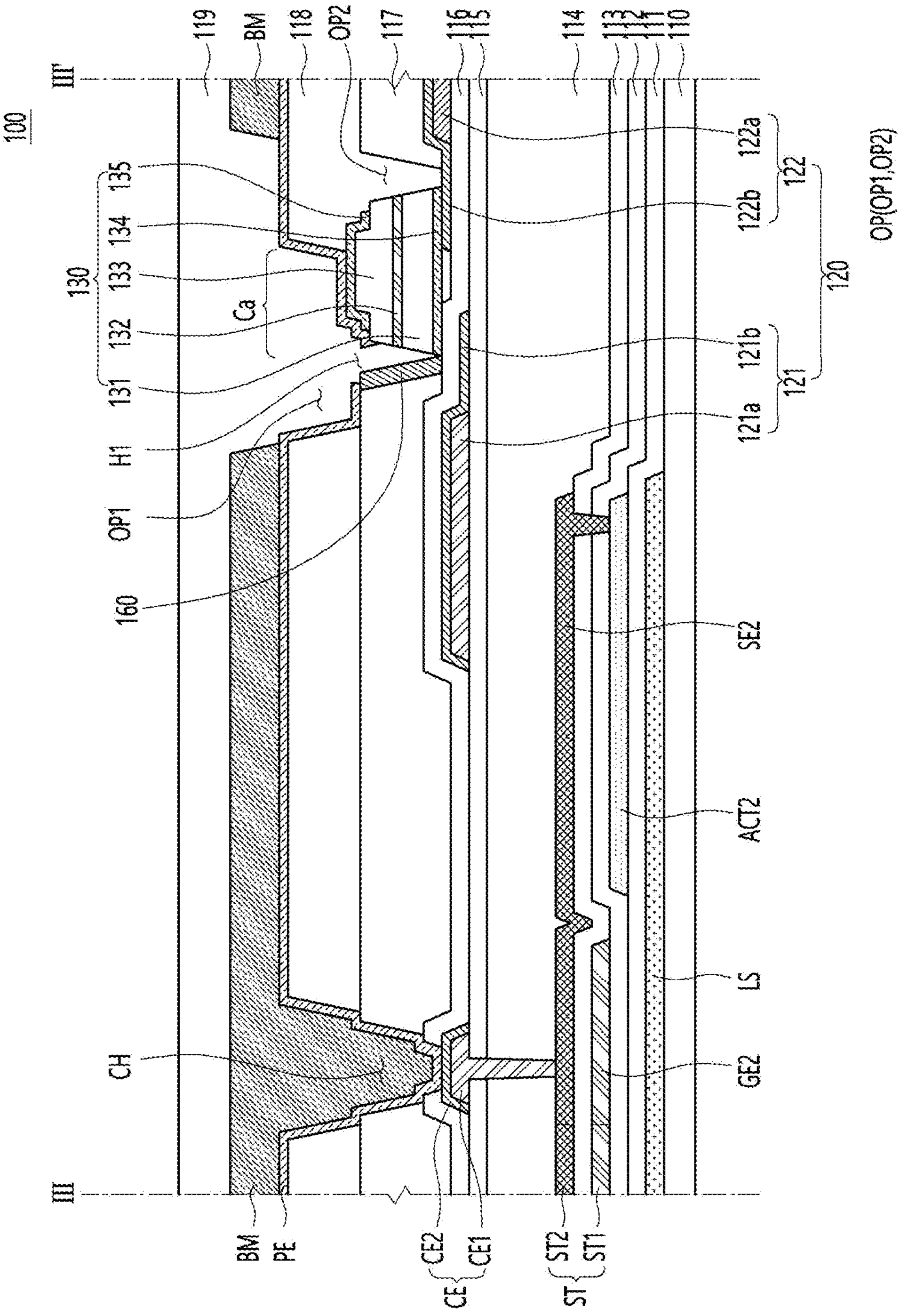

DISPLAY DEVICE COMPRISING SEMICONDUCTOR LIGHT-EMITTING ELEMENT

CROSS REFERENCE TO RELATED APPLICATIONS

This application is the National Phase of PCT International Application No. PCT/KR2022/010779, filed on Jul. 22, 2022, which claims priority under 35 U.S.C. 119 (a) to Patent Application No. 10-2021-0096311, filed in the Republic of Korea on Jul. 22, 2021, all of which are hereby expressly incorporated by reference into the present application.

TECHNICAL FIELD

The embodiment relates to a display device, and more specifically, to a display device using a semiconductor light emitting device.

BACKGROUND ART

There are organic light emitting displays (OLED) that emit light on their own, liquid crystal displays (LCD) and micro-LED displays that require a separate light source in the display devices used in computer monitors, TVs, mobile phones, etc.

Micro-LED display is a display that uses micro-LED, a semiconductor light emitting device with a diameter or cross-sectional area of 100 μm or less, as a display device.

Micro-LED displays use micro-LED, a semiconductor light emitting device, as a display device, so they have excellent performance in many characteristics such as contrast ratio, response speed, color gamut, viewing angle, brightness, resolution, lifespan, luminous efficiency, and luminance.

In particular, the micro-LED display has the advantage of being able to freely adjust the size and resolution and implement a flexible display because the screen may be separated and combined in a modular manner.

However, because large micro-LED displays require more than millions of micro-LEDs, there is a technical problem that makes it difficult to quickly and accurately transfer micro-LEDs to the display panel. Meanwhile, methods for transferring a semiconductor light emitting device to a substrate include a pick and place process, a laser lift-off method, or a self-assembly method.

Among these, the self-assembly method is a method in which the semiconductor light emitting device finds its assembly position within the fluid on its own, and is an advantageous method for implementing a large-screen display device.

Meanwhile, when transferring a light emitting device in a fluid, a problem arises where the assembly wiring is corroded by the fluid. Corrosion of the assembly wiring may cause an electrical short circuit and cause assembly defects.

Adding a technical object

DISCLOSURE

Technical Problem

The technical object of the embodiment is to provide a display device that may minimize the process margin for forming a contact part on a light emitting device in the pixel electrode manufacturing process.

Additionally, the technical object of the embodiment is to provide a display device with high resolution using a light-emitting device with a small metal area of the second electrode in contact with the pixel electrode.

Additionally, the technical object of the embodiment is to provide a display device that may prevent short circuit between the pixel electrode and the light emitting device.

Another technical object of the embodiment is to provide a display device that suppresses separation of self-assembled light-emitting elements.

Additionally, the technical object of the embodiment is to provide a display device with improved light extraction efficiency.

In addition, the technical object of the embodiment is to provide a display device with improved self-assembly of light-emitting elements.

Additionally, the technical object of the embodiment is to provide a display device with a reduced panel thickness.

In addition, the technical object of the embodiment is to provide a display device that may prevent short circuit between the upper electrode and the lower electrode.

The objects of the embodiment are not limited to the objects mentioned above, and other objects not mentioned will be clearly understood by those skilled in the art from the description below.

Technical Solution

A display device including a semiconductor light emitting device according to an embodiment includes a substrate:

First assembly wiring and second assembly wiring alternately arranged on the substrate and spaced apart from each other; a planarization layer disposed on the first assembly wiring and the second assembly wiring and having a plurality of openings and a plurality of contact portions; a light emitting device disposed inside the plurality of openings, the first electrode overlapping the first assembly wiring and the second assembly wiring; and a plurality of pixel electrodes disposed on the planarization layer and in contact with a second electrode of the light-emitting device through the plurality of contact portions, wherein the plurality of contact parts may overlap a portion of at least one side of the area where the light emitting device is disposed.

In addition, in the embodiment, the planarization layer includes: a first planarization layer disposed on the first assembly wiring and the second assembly wiring, and a second planarization layer disposed on the first planarization layer, the second planarization layer may be in contact with a portion of the second assembly wiring and one end of the second electrode, and the other end of the second electrode may be in contact with the plurality of pixel electrodes.

In addition, in an embodiment, the plurality of openings include a first opening disposed in the first planarization layer and the second planarization layer and overlapping a portion of the plurality of contact parts and the first assembly wiring and a second opening disposed in the first planarization layer and overlapping a portion of the second assembly wiring, the first opening may overlap a plurality of holes disposed in the plurality of pixel electrodes.

In addition, in an embodiment, the plurality of contact parts may include an inclined part and a concave part formed along three sides formed along the inner wall of the second planarization layer.

Additionally, in an embodiment, it includes a protective layer disposed on the plurality of pixel electrodes and the second planarization layer, One side of the light emitting device may be in contact with the second planarization layer, and the other side of the light emitting device and the plurality of contact parts may be in contact with the protective layer.

Additionally, in an embodiment, the first planarization layer may have a reverse taper shape.

Additionally, in an embodiment, it includes an insulating layer disposed between the light emitting device and the first planarization layer, and the insulating layer may cover the entire side surface of the first electrode.

Additionally, in an embodiment, a reflective layer in contact with the first planarization layer and disposed inside the plurality of openings may be further included.

Additionally, in an embodiment, the first assembly wiring may vertically overlap the second assembly wiring, and the second assembly wiring may include an electrode hole in a region that vertically overlaps the first assembly wiring.

Additionally, in an embodiment, the first assembly wiring includes a first conductive layer, the second assembly wiring includes a second conductive layer, and the first and second conductive layers may not vertically overlap the plurality of openings.

In addition, a display device including a semiconductor light emitting device according to an embodiment includes a substrate; assembly wiring disposed on the substrate; a light emitting device disposed on the assembly wiring; a plurality of pixel electrodes disposed on the light emitting device and having a plurality of holes; a planarization layer disposed on the assembly wiring and overlapping one side of the light emitting device.

A first opening disposed on the other side of the light emitting device; and a second opening disposed on one side of the light emitting device, wherein the plurality of holes may be disposed in the first opening.

Additionally, in an embodiment, the plurality of pixel electrodes include a plurality of contact parts overlapping the first opening, the plurality of contact portions may be composed of inclined portions and concave portions, and the inclined portion may be an area where three sides arranged along the inner wall of the planarization layer are connected, and the concave portion may be an area where the light emitting device and the plurality of pixel electrodes come into contact with each other.

In addition, in an embodiment, the first electrode of the light-emitting device is in contact with the assembly wiring, and the second electrode of the light-emitting device is in contact with the plurality of pixel electrodes through the plurality of contact portions, and the plurality of contact parts may overlap a portion of at least one side of the area where the light emitting device is disposed.

Additionally, in an embodiment, the plurality of contact parts may contact the plurality of holes.

Additionally, in an embodiment, the planarization layer includes: a first planarization layer disposed on the assembly wiring, and a second planarization layer disposed on the first planarization layer, and a protective layer may be disposed on the second planarization layer and the plurality of pixel electrodes, the second planarization layer may be in contact with one side of the light-emitting device, and the protective layer may be in contact with the other side of the light-emitting device.

Advantageous Effects

According to the embodiment, there is a technical effect of forming the contact part in various ways by arranging the planarization layer so that the contact part where the pixel electrode and the light emitting device are in contact is formed in an area biased to one side rather than in the center of the area where the light emitting device is placed.

In addition, the embodiment has the technical effect of providing a high-resolution display device using a micro light-emitting device by minimizing the process margin of the pixel electrode on the light-emitting device.

In addition, the embodiment has the technical effect of minimizing the occurrence of defects due to separation of the light emitting device by the arrangement of the planarization layer and the protective layer.

Additionally, the embodiment has the technical effect of minimizing short-circuit defects in a plurality of light-emitting devices.

In addition, the embodiment may minimize the process margin of the pixel electrode (PE), which has the technical effect of improving the reliability of a high-resolution display device using a micro light-emitting device.

In addition, the embodiment has the technical effect of reducing the thickness of the panel because the assembly hole and the conductive layer do not overlap.

In addition, the embodiment has the technical effect of improving the assembly force for the light emitting device through vertical overlap of the assembly wiring.

Additionally, the embodiment has the technical effect of improving light extraction efficiency by using a reflective layer.

The effects according to the embodiment are not limited by the contents exemplified above, and a wider variety of effects are included within the present invention.

DESCRIPTION OF DRAWINGS

FIG. 1 is a schematic plan view of a display device according to an embodiment.

FIG. 2 is a schematic enlarged plan view of a display device according to an embodiment.

FIG. 3 is a cross-sectional view taken along line III-III' of FIG. 2.

FIGS. 4A and 4B are process diagrams for explaining the process of self-assembling a plurality of light-emitting devices.

FIG. 4*c* is a schematic plan view of a mother substrate used for self-assembly of a plurality of light-emitting devices.

FIG. 5 is a cross-sectional view of a display device according to a second embodiment.

FIG. 6 is a cross-sectional view of a display device according to a third embodiment.

FIG. 7 is a schematic enlarged plan view of a display device according to a fourth embodiment.

FIG. 8 is a cross-sectional view of a display device according to the fifth embodiment.

FIG. 9 is a cross-sectional view of a display device according to the sixth embodiment.

FIG. 10 is an enlarged perspective view of a portion of the display device according to the sixth embodiment.

FIG. 11 is a cross-sectional view of a display device according to the seventh embodiment.

MODE FOR INVENTION

Hereinafter, embodiments disclosed in this specification will be described in detail with reference to the attached drawings. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, area or substrate is referred to as being 'on' another component, this includes either directly on the other element or there may be other intermediate elements in between.

Display devices described in this specification include digital TVs, mobile phones, smart phones, laptop computers, digital broadcasting terminals, personal digital assistants (PDAs), portable multimedia players (PMPs), navigation, and slates PCs, tablet PCs, ultra-books, desktop computers, etc. However, the features according to the embodiment described in this specification may be applied to a device capable of displaying even if it is a new product type that is developed in the future.

Hereinafter, embodiments will be described with reference to the drawings.

FIG. 1 is a schematic plan view of a display device according to an embodiment. For convenience of explanation, only the substrate 110 and the plurality of sub-pixels (SP) among the various components of the display device 100 are shown in FIG. 1.

The substrate 110 is configured to support various components included in the display device 100 and may be made of an insulating material. For example, the substrate 110 may be made of glass or resin. Additionally, the substrate 110 may include polymer or plastic, or may be made of a material with flexibility.

The substrate 110 includes a display area (AA) and a non-display area (NA).

The display area AA is an area where a plurality of sub-pixels SP are arranged and an image is displayed. Each of the plurality of sub-pixels (SP) is an individual unit that emits light, and a semiconductor light emitting device (LED) and a driving circuit are formed in each of the plurality of sub-pixels (SP). For example, the plurality of sub-pixels SP may include, but are not limited to, a red sub-pixel, a green sub-pixel, a blue sub-pixel, and/or a white sub-pixel. Hereinafter, the description will be made on the assumption that the plurality of sub-pixels SP includes a red sub-pixel, a green sub-pixel, and a blue sub-pixel, but is not limited thereto.

The non-display area (NA) is an area where images are not displayed, and is an area where various wiring, driver ICs, etc. for driving the sub-pixels (SP) arranged in the display area (AA) are placed. For example, various ICs such as gate driver ICs and data driver ICs and driving circuits may be placed in the non-display area (NA). Meanwhile, the non-display area NA may be located on the back of the substrate 110, that is, on the side without the sub-pixel SP, or may be omitted, and is not limited to what is shown in the drawing.

The display device 100 of the embodiment may drive the light emitting device including an active matrix (AM) method or a passive matrix (PM) method.

Hereinafter, FIGS. 2 and 3 will be referred to together for a more detailed description of the plurality of sub-pixels (SP).

FIG. 2 is a schematic enlarged plan view of a display device according to an embodiment. FIG. 3 is a cross-sectional view taken along line III-III' of FIG. 2. Referring to FIGS. 2 and 3, a display device 100 according to an embodiment may include Multiple scan wirings (SL), multiple data wirings (DL), multiple high potential power supply wirings (VDD), a plurality of assembly wirings 120, a plurality of reference wirings (RL) and a black matrix (BM), and a plurality of sub-pixels (SP), each of the first transistor (TR1), second transistor (TR2), third transistor (TR3), storage capacitor (ST), semiconductor light emitting device (LED), light blocking layer (LS), buffer layer 111, gate insulating layer 112, a plurality of passivation layers (113, 115, 116), a plurality of planarization layers (114, 117, 118), a connection electrode (CE), a plurality of pixel electrodes (PE), a plurality of holes (H1), a plurality of contact portions (Ca), etc.

Referring to FIGS. 2 and 3, a plurality of data lines (DL), a first layer (VDD1) and a second layer (VDD2) of a high-potential power line (VDD), a plurality of reference wirings (RL) and a plurality of assembly wirings 120 are extends in the column direction between the plurality of sub-pixels (SP), and the third layer VDD3 of the plurality of scan lines SL and the high potential power line VDD may extend in the row direction between the plurality of sub-pixels SP. Additionally, a first transistor TR1, a second transistor TR2, a third transistor TR3, and a storage capacitor ST may be disposed in each of the plurality of sub-pixels SP.

First, the first layer (VDD1) and the light blocking layer (LS) of the high-potential power supply line (VDD) may be disposed on the substrate 110.

The high-potential power supply line (VDD) is a line that transmits a high-potential power supply voltage to each of a plurality of sub-pixels (SP). A plurality of high-potential power supply lines (VDD) may transmit a high-potential power supply voltage to the second transistor TR2 of each of the plurality of sub-pixels (SP).

Meanwhile, a plurality of high-potential power wiring (VDD) may be made of a single layer or multiple layers, hereinafter, for convenience of explanation, the description will be made on the assumption that a plurality of high-potential power supply lines (VDDs) are composed of a plurality of layers.

The high-potential power line (VDD) includes a plurality of first layers (VDD1), a plurality of second layers (VDD2), and a plurality of third layers (VDD3) connecting them. The first layer VDD1 may extend in the column direction between each of the plurality of sub-pixels SP.

The light blocking layer LS may be disposed in each of the plurality of sub-pixels SP on the substrate 110. The light blocking layer LS blocks light incident from the lower part of the substrate 110 to the second active layer ACT2 of the second transistor TR2, which will be described later, and may minimize leakage current.

The buffer layer 111 may be disposed on the first layer (VDD1) and the light blocking layer (LS) of the high-potential power line (VDD). The buffer layer 111 may reduce penetration of moisture or impurities through the substrate 110. The buffer layer 111 may be composed of, for example, a single layer or a multiple layer of silicon oxide (SiOx) or silicon nitride (SiNx), but is not limited thereto. However, the buffer layer 111 may be omitted depending on the type of substrate 110 or the type of transistor, but is not limited thereto.

A plurality of scan wires (SL), a plurality of reference wires (RL), a plurality of data wires (DL), a first transistor (TR1), a second transistor (TR2), a third transistor (TR3), and a storage capacitor (ST) may be disposed on the buffer layer 111.

First, the first transistor TR1 may be disposed in each of the plurality of sub-pixels SP. The first transistor TR1 includes a first active layer ACT1, a first gate electrode GE1, a first source electrode SE1, and a first drain electrode DE1. The first active layer (ACT1) may be disposed on the buffer layer (111). The first active layer (ACT1) may be made of a semiconductor material such as oxide semiconductor, amorphous silicon, or polysilicon, but is not limited thereto.

The gate insulating layer 112 may be disposed on the first active layer ACT1. The gate insulating layer 112 is an insulating layer for insulating the first active layer (ACT1) and the first gate electrode (GE1), and may be composed of a single layer or multiple layers of silicon oxide (SiOx) or silicon nitride (SiNx), but is not limited thereto.

The first gate electrode GE1 may be disposed on the gate insulating layer 112. The first gate electrode GE1 may be electrically connected to the scan line SL. The first gate electrode GE1 may be made of a conductive material, such as copper (Cu), aluminum (Al), molybdenum (Mo), nickel (Ni), titanium (Ti), chromium (Cr), or an alloy thereof, but is not limited to this.

The first passivation layer 113 may be disposed on the first gate electrode GE1. Contact holes are formed in the first passivation layer 113 to connect the first source electrode SE1 and the first drain electrode DE1 to the first active layer ACT1. The first passivation layer 113 is an insulating layer to protect the structure below the first passivation layer 113, and may be composed of a single layer or multiple layers of silicon oxide (SiOx) or silicon nitride (SiNx), but is not limited to this.

A first source electrode (SE1) and a first drain electrode (DE1) electrically connected to the first active layer (ACT1) may be disposed on the first passivation layer 113. The first drain electrode DE1 may be connected to the data line DL, and the first source electrode SE1 may be connected to the second gate electrode GE2 of the second transistor TR2. The first source electrode (SE1) and the first drain electrode (DE1) may be made of a conductive material, for example, copper (Cu), aluminum (Al), molybdenum (Mo), nickel (Ni), titanium (Ti), chromium (Cr), or an alloy thereof, but is not limited to this.

Meanwhile, in the embodiment, the first source electrode (SE1) and the first drain electrode (DE1) were described as being connected to the second gate electrode (GE2) and the data line (DL), respectively, depending on the type of transistor, the first source electrode SE1 may be connected to the data line DL, the first drain electrode DE1 may be connected to the second gate electrode GE2 of the second transistor TR2, but is not limited to this.

The first gate electrode GE1 of the first transistor TR1 is connected to the scan line SL, and may be turned on or off depending on the scan signal. The first transistor TR1 may transfer a data voltage to the second gate electrode GE2 of the second transistor TR2 based on the scan signal, and may be referred to as a switching transistor.

Meanwhile, a plurality of data lines DL and a plurality of reference lines RL may be disposed on the gate insulating layer 112 along with the first gate electrode GE1. The plurality of data lines DL and the reference lines RL may be formed of the same material and process as the first gate electrode GE1. The plurality of data lines DL are lines that transmit data voltages to each of the plurality of sub-pixels SP. The plurality of data lines DL may transmit data voltage to the first transistor TR1 of each of the plurality of sub-pixels SP. For example, the plurality of data lines (DL) include a data line (DL) that transmits the data voltage to the red sub-pixel (SPR), a data line (DL) that transmits the data voltage to the green sub-pixel (SPG) and a data line DL2 that transmits a data voltage to the blue sub-pixel SPB.

The plurality of reference wires (RL) are wires that transmit a reference voltage to each of the plurality of sub-pixels (SP). The plurality of reference lines RL may transmit a reference voltage to the third transistor TR3 of each of the plurality of sub-pixels SP.

The second transistor TR2 may be disposed in each of the plurality of sub-pixels SP. The second transistor TR2 may include a second active layer ACT2, a second gate electrode GE2, a second source electrode SE2, and a second drain electrode DE2. The second active layer (ACT2) may be disposed on the buffer layer 111. The second active layer (ACT2) may be made of a semiconductor material such as oxide semiconductor, amorphous silicon, or polysilicon, but is not limited thereto.

The second transistor TR2 may be disposed in each of the plurality of sub-pixels SP. The second transistor TR2 may include a second active layer ACT2, a second gate electrode GE2, a second source electrode SE2, and a second drain electrode DE2. The second active layer (ACT2) may be disposed on the buffer layer 111. The second active layer (ACT2) may be made of a semiconductor material such as oxide semiconductor, amorphous silicon, or polysilicon, but is not limited thereto.

The gate insulating layer 112 is disposed on the second active layer ACT2, and the second gate electrode GE2 is disposed on the gate insulating layer 112. The second gate electrode GE2 may be electrically connected to the first source electrode SE1 of the first transistor TR1. The second gate electrode GE2 may made of a conductive material, such as copper (Cu), aluminum (Al), molybdenum (Mo), nickel (Ni), titanium (Ti), chromium (Cr), or an alloy thereof, but is not limited to this.

The first passivation layer 113 is disposed on the second gate electrode (GE2), and the second source electrode (SE2) and the second drain electrode (DE2) are disposed on the first passivation layer 113. The second source electrode SE2 is electrically connected to the second active layer ACT2. The second drain electrode DE2 is electrically connected to the second active layer ACT2 and at the same time is electrically connected to the high potential power supply line VDD. The second drain electrode DE2 may be disposed between the first layer VDD1 and the second layer VDD2 of the high potential power line VDD and electrically connected to the high potential power line VDD.

The second transistor TR2 has a second gate electrode GE2 connected to the first source electrode SE1 of the first transistor TR1, and may be turned on by the data voltage transmitted when the first transistor TR1 is turned on. And the turned-on second transistor TR2 may transfer a driving current to the light emitting device (LED) based on the high-potential power supply voltage from the high-potential power supply line (VDD), and thus may be referred to as a driving transistor.

The third transistor TR3 may be disposed in each of the plurality of sub-pixels SP. The third transistor TR3 may include a third active layer ACT3, a third gate electrode GE3, a third source electrode SE3, and a third drain electrode DE3. The third active layer (ACT3) may be disposed on the buffer layer 111. The third active layer (ACT3) may be made of a semiconductor material such as oxide semiconductor, amorphous silicon, or polysilicon, but is not limited thereto.

The gate insulating layer 112 may be disposed on the third active layer ACT3, and the third gate electrode GE3 may be disposed on the gate insulating layer 112. The third gate electrode GE3 is connected to the scan line SL, and the third transistor TR3 may be turned on or off by the scan signal.

The third gate electrode GE3 may made of a conductive material, such as copper (Cu), aluminum (Al), molybdenum (Mo), nickel (Ni), titanium (Ti), chromium (Cr), or an alloy thereof, but is not limited to this.

However, it was explained that the third gate electrode (GE3) and the first gate electrode (GE1) were connected to the same scan line (SL), and the third gate electrode GE3 may be connected to a different scan line SL from the first gate electrode GE1, but is not limited thereto.

The first passivation layer 113 is disposed on the third gate electrode GE3, and a third source electrode (SE3) and a third drain electrode (DE3) may be disposed on the first passivation layer 113. The third source electrode (SE3) is formed integrally with the second source electrode (SE2) and may be electrically connected to the third active layer (ACT3) and simultaneously to the second source electrode (SE2) of the second transistor (TR2). And the third drain electrode DE3 may be electrically connected to the reference wiring RL.

The third transistor TR3 electrically connected to the second source electrode (SE2), reference wiring (RL), and storage capacitor (ST) of the second transistor (TR2), which is a driving transistor, may be referred to as a sensing transistor.

A storage capacitor (ST) may be disposed in each of the plurality of sub-pixels (SP). The storage capacitor ST includes a first capacitor electrode ST1 and a second capacitor electrode ST2. The storage capacitor ST is connected between the second gate electrode GE2 and the second source electrode SE2 of the second transistor TR2, and by storing the voltage, the voltage level of the gate electrode of the second transistor TR2 may be maintained constant while the light emitting device (LED) emits light.

The first capacitor electrode ST1 may be integrated with the second gate electrode GE2 of the second transistor TR2. Accordingly, the first capacitor electrode ST1 may be electrically connected to the second gate electrode GE2 of the second transistor TR2 and the first source electrode SE1 of the first transistor TR1.

The second capacitor electrode (ST2) may be disposed on the first capacitor electrode (ST1) with the first passivation layer 113 interposed therebetween. The second capacitor electrode ST2 may be integrated with the second source electrode SE2 of the second transistor TR2 and the third source electrode SE3 of the third transistor TR3. Accordingly, the second capacitor electrode ST2 may be electrically connected to the second transistor TR2 and the third transistor TR3.

Meanwhile, a plurality of scan wires SL may be disposed on the first passivation layer 113 together with First source electrode (SE1), first drain electrode (DE1), second source electrode (SE2), second drain electrode (DE2), a third source electrode (SE3), third drain electrode (DE3), and second capacitor electrode (ST2).

The plurality of scan wires (SL) are wires that transmit scan signals to each of the plurality of sub-pixels (SP). The plurality of scan lines SL may transmit scan signals to the first transistor TR1 of each of the plurality of sub-pixels SP. For example, each of the plurality of scan lines SL extends in the row direction and may transmit a scan signal to a plurality of sub-pixels SP arranged in the same row.

Next, the overcoating layer 114 may be disposed on a plurality of scan wires (SL), a plurality of reference wires (RL), a plurality of data wires (DL), a first transistor (TR1), a second transistor (TR2), a third transistor (TR3), and storage capacitor (ST). The overcoating layer 114 may planarize the upper part of the substrate 110 on which the plurality of transistors are disposed. The overcoating layer 114 may be composed of a single layer or a double layer, and may be made of, for example, an acrylic-based organic material, but is not limited thereto.

The second passivation layer 115 is disposed on the overcoating layer 114. The second passivation layer 115 is an insulating layer for protecting the structure below the second passivation layer 115 and improving the adhesion of the structure formed on the second passivation layer 115, and may be composed of a single layer or multiple layers of silicon oxide (SiOx) or silicon nitride (SiNx), but is not limited thereto.

The second layer (VDD2) of the high-potential power supply wiring (VDD), the plurality of first assembly wirings 121 among the plurality of assembly wirings 120 and the connection electrode (CE) may be disposed on the second passivation layer 115.

First, the plurality of assembly wirings 120 generates an electric field for aligning a plurality of light emitting devices (LEDs) when manufacturing the display device 100, and supplies a low-potential power supply voltage to the plurality of light emitting devices (LEDs) when the display device 100 is driven. Accordingly, the assembly wiring 120 may be referred to as a low-potential power wiring. The plurality of assembly wirings 120 are arranged in a column direction along the plurality of sub-pixels SP arranged on the same line. For example, one first assembly wiring 121 and a second assembly wiring 122 are disposed in a red sub-pixel (SPR) arranged in the same row, the one first assembly wire 121 and one second assembly wire 122 are disposed in the green sub-pixel (SPG), and the one first assembly wiring 121 and one second assembly wiring 122 may be disposed in the blue sub-pixel SPB.

The plurality of assembly wiring lines 120 includes a plurality of first assembly wiring lines 121 and a plurality of second assembly wiring lines 122. When the display device 100 is driven, the same low-potential voltage may be applied as alternating current to the plurality of first assembly wirings 121 and the plurality of second assembly wirings 122. The plurality of first assembly wires 121 and the plurality of second assembly wires 122 may be alternately arranged. Additionally, in each of the plurality of sub-pixels SP, one first assembly wiring 121 and one second assembly wiring 122 may be disposed adjacent to each other.

The plurality of first assembly wirings 121 and the plurality of second assembly wirings 122 may be made of a conductive material, such as copper (Cu) and chromium (Cr), but is not limited to this.

The plurality of first assembly wirings 121 include a first conductive layer 121*a* and a first clad layer 121*b*. The first conductive layer 121*a* may be disposed on the second passivation layer 115. The first clad layer 121*b* may be in contact with the first conductive layer 121*a*. For example, the first clad layer 121*b* may be disposed to cover the top and side surfaces of the first conductive layer 121*a*. And the first conductive layer 121*a* may have a thickness greater than that of the first clad layer 121*b*.

The first clad layer 121*b* is made of a material that is more resistant to corrosion than the first conductive layer 121*a*, and when manufacturing the display device 100, the first conductive layer 121*a* of the first assembly wiring 121 and the second assembly wiring (Short circuit defects due to migration between the second conductive layers 122*a* of 122) may be minimized. For example, the first clad layer 121*b* may be made of molybdenum (Mo), molybdenum titanium (MoTi), etc., but is not limited thereto.

The first clad layer 121*b* of the plurality of first assembly wirings 121 extends toward the opening OP instead of the first conductive layer 121*a* that does not overlap the opening OP, so that may form an electric field for self-assembly of a plurality of light emitting devices (LEDs).

A portion of the first clad layer 121*b* overlaps the first planarization layer 117, and the remaining portion of the first clad layer 121*b* may extend inside the opening OP and overlap a plurality of light emitting devices LED. However, since the third passivation layer 116 is disposed on the first clad layer 121*b*, the first clad layer 121*b* may not be in contact with the first electrode 134 of the plurality of light emitting devices (LEDs).

A second layer (VDD2) of the high potential power supply line (VDD) is disposed on the second passivation layer (115). The second layer (VDD2) extends in the column direction between each of the plurality of sub-pixels (SP) and may overlap the first layer (VDD1). The first layer (VDD1) and the second layer (VDD2) may be electrically connected through a contact hole formed in the insulating layers formed between the first layer (VDD1) and the second layer (VDD2). The second layer VDD2 may be formed of the same material and process as the first assembly wiring 121, but is not limited thereto.

The connection electrode CE may be disposed in each of the plurality of sub-pixels SP. The connection electrode CE is electrically connected to the second capacitor electrode ST2 and the second source electrode SE2 of the second transistor TR2 through a contact hole formed in the second passivation layer 115. The connection electrode (CE) is an electrode for electrically connecting the light emitting device (LED) and the second transistor (TR2), which is a driving transistor, and includes a first connection layer (CE1) and a second connection layer (CE2). For example, the first connection layer CE1 may be formed of the same material on the same layer as the first conductive layer 121*a* of the first assembly wiring 121, and the second connection layer CE2 may be formed of the same material as the first clad layer 121*b*.

Subsequently, the passivation layer 116 may be thirdly disposed on the second layer (VDD2), the first assembly wiring 121, and the connection electrode (CE). The third passivation layer 116 is an insulating layer to protect the structure below the third passivation layer 116, and may be composed of a single layer or multiple layers of silicon oxide (SiOx) or silicon nitride (SiNx), but is limited thereto. In addition, the third passivation layer 116 may function as an insulating layer to prevent short circuit defects due to migration between the first assembly wiring 121 and the second assembly wiring 122 when manufacturing the display device 100, this will be described later with reference to FIGS. 4A to 4C.

Among the plurality of assembly wiring lines 120, a plurality of second assembly wiring lines 122 may be disposed on the third passivation layer 116. Each of the plurality of second assembly wirings 122 is disposed in a plurality of sub-pixels SP arranged on the same line as described above, and the plurality of first assembly wires 121 and the plurality of second assembly wires 122 may be arranged to be spaced apart from each other.

Each of the plurality of second assembled wiring 122 may include a second conductive layer 122*a* and a second clad layer 122*b*. The second conductive layer 122*a* is disposed on the third passivation layer 116. And the second clad layer 122*b* may be electrically connected to the second conductive layer 122*a*. For example, the second clad layer 122*b* may be disposed to cover the top and side surfaces of the second conductive layer 122*a*. And the second conductive layer 122*a* may have a thickness greater than that of the second clad layer 122*b*.

The second clad layer (122*b*), like the first clad layer (121*b*), is also made of a material that is more resistant to corrosion than the second conductive layer (122*a*), when manufacturing the display device 100, there is a technical effect of minimizing short circuit defects due to migration between the first assembly wiring 121 and the second assembly wiring 122. For example, the second clad layer 122*b* may be made of molybdenum (Mo), molybdenum titanium (MoTi), etc., but is not limited thereto.

The second clad layer 122*b* of the plurality of second assembly wirings 122 extends toward the opening OP instead of the second conductive layer 122*a* that does not overlap the opening OP, so that may form an electric field for self-assembly of a plurality of light emitting devices (LEDs) together with the first clad layer 121*b*.

A portion of the second clad layer 122*b* overlaps the first planarization layer 117, and the remaining portion of the second clad layer 122*b* may extend inside the opening OP and overlap a plurality of light emitting devices LED. At this time, since the second clad layer 122*b* is disposed on the third passivation layer 116, the second clad layer 122*b* and the first electrode 134 of the plurality of light emitting devices (LEDs) may contact each other, and may supply alternating current low-potential power voltage from the second assembly wiring 122 to the plurality of light emitting devices (LEDs).

Next, the first planarization layer 117 may be disposed on the plurality of second assembly wirings 122. The first planarization layer 117 may be composed of a single layer or a double layer, and may be made of, for example, an acryl-based organic material, but is not limited thereto.

Meanwhile, the first planarization layer 117 may include a plurality of openings OP on which each of the plurality of light emitting devices (LEDs) is seated, and a plurality of contact holes CH exposing each of the plurality of connection electrodes CE.

A plurality of openings OP may be disposed in each of the plurality of sub-pixels SP. At this time, one or more openings OP may be disposed in one sub-pixel SP. For example, one opening OP or two openings OP may be disposed in one sub-pixel SP.

The plurality of openings OP are parts where a plurality of light emitting devices (LEDs) are inserted, and may also be referred to as pockets. The plurality of openings OP may be formed to overlap the plurality of assembly wirings 120. For example, one opening OP may overlap the first assembly wiring 121 and the second assembly wiring 122 disposed adjacent to each other in one sub-pixel SP.

A plurality of openings OP are disposed in a plurality of light emitting devices (LED) and the first planarization layer 117 and the second planarization layer 118. The plurality of openings OP are areas where open areas formed by the first planarization layer 117 and the second planarization layer 118 are connected, and includes a first opening (OP1) located on the other side of the light emitting device (LED), and includes a second opening OP2 which is an area opened by the first planarization layer 117, located on one side of the light emitting device LED and outside the first opening OP1. The first opening OP1 overlaps a portion of the first assembly wiring 121 and exposes the other side of the first electrode 134 and a portion of the third passivation layer 116. The second opening OP2 overlaps a portion of the second assembly wiring 122 and exposes one side of the first electrode 134 and a portion of the second conductive layer 122*a*. The second planarization layer 118 is disposed on the first planarization layer, and is also disposed on the exposed second conductive layer 122*a* and on one side of the light emitting device (LED). The first opening OP1 includes a contact portion Ca formed to electrically connect the pixel electrode PE and the second electrode 135 of the light emitting device.

A plurality of contact holes (CH) may be disposed in a plurality of sub-pixels (SP). The plurality of contact holes (CH) are portions that expose the connection electrodes (CE) of each of the plurality of sub-pixels (SP). The connection electrode (CE) under the first planarization layer 117 is exposed through a plurality of contact holes (CH) and may be electrically connected to the light emitting device (LED) through the pixel electrode (PE), and may transmit the driving current from the second transistor TR2 to the light emitting device (LED).

The plurality of light emitting devices (LEDs) are light emitting devices (LEDs) that emit light by electric current. The plurality of light emitting devices (LEDs) may include light emitting devices (LEDs) that emit red light, green light, blue light, etc., and a combination of these may produce light of various colors, including white. For example, the light emitting device (LED) may be a light emitting diode (LED) or a micro LED, but is not limited thereto.

Hereinafter, the description will be made on the assumption that the plurality of light-emitting devices (LEDs) include a red light-emitting device 130 disposed in the red sub-pixel (SPR), a green light-emitting device 140 disposed in the green sub-pixel (SPG), and a blue light-emitting device 150 disposed in the blue sub-pixel (SPB). However, the plurality of light emitting devices (LEDs) are composed of light emitting devices (LEDs) that emit light of the same color, and may display images of various colors by using a separate light conversion member that converts light from a plurality of light emitting devices (LEDs) into light of different colors, but is not limited thereto.

The plurality of light-emitting devices (LEDs) include a red light-emitting device 130 disposed in the red sub-pixel (SPR) and a green light-emitting device 140 disposed in the green sub-pixel (SPG) and a blue light-emitting device 150 disposed in the blue sub-pixel (SPB). Each of the red light-emitting device 130, the green light-emitting device 140, and the blue light-emitting device 150 may include a first semiconductor layer, a second semiconductor layer, a first electrode, and a second electrode in common. And the red light-emitting device 130 includes a light-emitting layer that emits red light, the green light-emitting device 140 includes a light-emitting layer that emits green light, and the blue light-emitting device 150 includes a light-emitting layer that emits blue light.

Referring to FIG. 3, the red light-emitting device 130 disposed in the red sub-pixel (SPR) has a second semiconductor layer 133 disposed on the first semiconductor layer 131. The first semiconductor layer 131 and the second semiconductor layer 133 may be layers formed by doping n-type and p-type impurities into a specific material. For example, the first semiconductor layer 131 and the second semiconductor layer 133 may include an AlInGaP-based semiconductor layer, for example a layer doped with a p-type or n-type impurity in a material such as indium aluminum phosphide (InAlP) or gallium arsenide (GaAs). The p-type impurities may be magnesium (Mg), zinc (Zn), beryllium (Be), etc., and the n-type impurities may be silicon (Si), germanium (Ge), tin (Sn), etc., but are not limited thereto.

A light emitting layer 132 that emits red light may be disposed between the first semiconductor layer 131 and the second semiconductor layer 133. The light emitting layer 132 may emit light by receiving holes and electrons from the first semiconductor layer 131 and the second semiconductor layer 133. The light-emitting layer 132 may be made of a single-layer or multi-quantum well (MQW) structure, and may be made of, for example, indium gallium nitride (InGaN) or gallium nitride (GaN), but is not limited thereto.

The first electrode 134 may be disposed on the lower surface of the first semiconductor layer 131, and the second electrode 135 may be disposed on the upper surface of the second semiconductor layer 133. The first electrode 134 is an electrode bonded to the second assembly wiring 122 exposed at the opening OP, The second electrode 135 is an electrode that electrically connects the second semiconductor layer 133 to a pixel electrode (PE), which will be described later. The first electrode 134 and the second electrode 135 may be formed of a conductive material.

At this time, in order to bond the first electrode 134 to the second assembly wiring 122, the first electrode 134 may be made of a eutectic metal. For example, the first electrode 134 may be made of tin (Sn), indium (In), zinc (Zn), Lead (Pb), nickel (Ni), gold (Au), platinum (Pt), copper (Cu) etc., but is not limited thereto.

And both the green light-emitting device 140 and the blue light-emitting device 150 may be formed in the same structure as the red light-emitting device 130. For example, the green light-emitting device 140 includes a first electrode, a first semiconductor layer on the first electrode, a green light-emitting layer on the first semiconductor layer, a second semiconductor layer on the green light-emitting layer, and a second electrode on the second semiconductor layer, and the blue light-emitting device may also have a structure in which a first electrode, a first semiconductor layer, a blue light-emitting layer, a second semiconductor layer, and a second electrode are sequentially stacked.

Next, the second planarization layer 118 may be disposed on one end of the plurality of light emitting devices (LEDs) and the first planarization layer 117. The second planarization layer 118 may planarize the upper part of the substrate 110 on which the plurality of light emitting devices (LEDs) are disposed. The second planarization layer 118 may contact one side of the light emitting device 130, one end of the second electrode 135, and a portion of the second assembly wiring 122 or the second clad layer 122*b*. Accordingly, one end of the plurality of light emitting devices (LED) may be stably fixed in the second opening OP2 by the second planarization layer 118. The second planarization layer 118 may be composed of a single layer or a double layer, and may be made of, for example, an acryl-based organic material, but is not limited thereto.

The pixel electrode (PE) may be disposed on the second planarization layer 118. The pixel electrode (PE) is an electrode for electrically connecting a plurality of light emitting devices (LED) and the connection electrode (CE). Pixel electrode (PE) may be electrically connected to the second electrode 135 of the light emitting device (LED), the connection electrode (CE), and the second transistor (TR2) through a contact portion (Ca) consisting of an inclined portion with three sides connected along the inner wall of the second planarization layer 118 and a concave portion where the pixel electrode (PE) and the light emitting device (LED) are in contact.

Since the first opening OP1 is not disposed only in the inner region of the second electrode 135, and a portion of the second electrode 135 and the first planarization layer 117 include a space where the other side of the light emitting device (LED) is spaced apart, so that It is possible to form the contact portion Ca, which includes an inclined portion and a concave portion disposed to contact the pixel electrode PE and the second electrode 135, with a larger area. Additionally, a high level difference of the second planarization layer 118 may be formed on the first planarization layer 117 by arranging the first opening OP1. The high level difference of the second planarization layer 118 prevents the pixel electrode PE from extending from the first planarization layer 117 to the top of the light emitting device (LED) and causes a hole H1 to be formed in the first opening OP1. That is, the hole H1 of the pixel electrode may be disposed in an area that overlaps the first opening OP1, and the contact portion Ca may be formed adjacent to the hole H1. Therefore, since the contact portion (Ca) is disposed in an area biased to one side rather than in the center of the area where the light emitting device (LED) is disposed, one side of the contact portion (Ca) coincides with one side forming the boundary line of the hole (H1).

A portion of the third passivation layer 116 may be exposed through the first opening OP1. On the other hand, since the third passivation layer 116 covers all of the first assembly wiring 121 in the first opening OP1, the first assembly wiring 121 overlaps the first opening OP1, but is not exposed through the first opening OP1. Meanwhile, in the second opening OP2, a portion of the second assembly wiring 122 may be exposed because the second assembly wiring 122 is disposed on the third passivation layer 116.

The third layer (VDD3) of the high-potential power line (VDD) may be disposed on the second planarization layer (118). The third layer (VDD3) may electrically connect the first layer (VDD1) and the second layer (VDD2) arranged in different rows. For example, the third layer (VDD3) extends in the row direction between the plurality of sub-pixels (SP), and may electrically connect a plurality of second layers (VDD2) of high-potential power wiring (VDD) extending in the column direction to each other. In addition, as the plurality of high-potential power wiring lines (VDD) are connected in a mesh form through the third layer (VDD3), the voltage drop phenomenon may be reduced.

The black matrix BM may be disposed on the second planarization layer 118. The black matrix BM may be disposed between the plurality of sub-pixels SP on the second planarization layer 118. The black matrix (BM) may reduce color mixing between the plurality of sub-pixels (SP). The black matrix (BM) may be made of an opaque material, for example, black resin, but is not limited thereto.

The protective layer 119 may be disposed on one end of the pixel electrode (PE), the second planarization layer 118, the black matrix (BM), and a plurality of light emitting devices (LED). The protective layer 119 and the first opening OP1 overlap, and in the overlapping area, the protective layer 119 may contact the other side of the light emitting device 130, the other side of the first electrode 134, and a portion of the third passivation layer 116. Accordingly, the other end of the plurality of light emitting devices (LED) is stably fixed in the first opening (OP1) by the protective layer 119, and one end of the plurality of light emitting devices (LED) may be stably fixed in the second opening OP2 by the second planarization layer 118.

The protective layer 119 is a layer to protect the structure below the protective layer 119, and may be composed of a single layer or multiple layers of translucent epoxy, silicon oxide (SiOx), or silicon nitride (SiNx), but is not limited to this.

Meanwhile, in the opening OP, the plurality of first assembly wirings 121 are spaced apart from the plurality of light emitting devices (LED), and only the plurality of second assembly wirings 122 may contact the plurality of light emitting devices (LEDs). This is to prevent defects that occur when a plurality of light emitting devices (LEDs) come into contact with both the first assembly wiring 121 and the plurality of second assembly wiring 122 during the manufacturing process of the display device 100. The third passivation layer 116 may be formed on the plurality of first assembly wirings 121, and the plurality of light emitting devices (LEDs) may be contacted only to the plurality of second assembly wirings 122.

Hereinafter, the manufacturing method of the display device 100 according to the embodiment will be described in detail with reference to FIGS. 4A to 4C.

FIGS. 4A and 4B are process diagrams for explaining the process of self-assembling a plurality of light-emitting devices. FIG. 4*c* is a schematic plan view of a mother substrate used for self-assembly of a plurality of light-emitting devices.

Referring to FIG. 4A, a light emitting device (LED) is introduced into the chamber (CB) filled with the fluid (WT). The fluid WT may include water, etc., and the chamber CB filled with the fluid WT may have an open top.

Next, the mother substrate 10 may be placed on the chamber (CB) filled with light emitting devices (LEDs). The mother substrate 10 is a substrate composed of a plurality of substrates 110 forming the display device 100, when self-assembling a plurality of light emitting devices (LEDs), the mother substrate 10 on which a plurality of assembly wirings 120 and the first planarization layer 117 are formed may be used.

And the mother substrate 10 formed with the first assembly wiring 121, the second assembly wiring 122, and the first planarization layer 117 is placed on the chamber CB or inserted into the chamber CB. At this time, the mother substrate 10 may be positioned so that the opening OP of the first planarization layer 117 and the fluid WT face each other.

Next, the magnet MG may be placed on the mother substrate 10. Light emitting devices (LEDs) that sink or float on the bottom of the chamber (CB) may move toward the mother substrate 10 by the magnetic force of the magnet (MG).

At this time, the light emitting device (LED) may include a magnetic material to move by a magnetic field. For example, the first electrode 134 or the second electrode 135 of the light emitting device (LED) may include a ferromagnetic material such as iron or cobalt.

Next, the light emitting device (LED) moved toward the first planarization layer 117 by the magnet MG may be self-assembled in the plurality of openings OP by the electric field formed by the first assembly wiring 121 and the second assembly wiring 122.

An alternating voltage may be applied to the plurality of first assembly wirings 121 and the plurality of second assembly wirings 122 to generate an electric field. Due to this electric field, the light emitting device (LED) is dielectrically polarized and may have polarity. And a dielectric polarized light emitting device (LED) may be moved or fixed in a specific direction by dielectrophoresis (DEP), that is, an electric field. Therefore, a plurality of light emitting devices (LED) may be fixed within the plurality of openings OP of the first planarization layer 117 using dielectrophoresis.

Next, using the electric fields of the plurality of first assembly wirings 121 and the plurality of second assembly wirings 122, the mother substrate 10 may be flipped 180° while the light emitting devices (LEDs) are fixed within the plurality of openings (OP). If the mother substrate 10 is turned over without applying voltage to the plurality of first assembly wirings 121 and the plurality of second assembly wirings 122, a plurality of light emitting devices (LEDs) may be separated from the plurality of openings (OP). Therefore, with voltage applied to the plurality of first assembly wirings 121 and the plurality of second assembly wirings 122, the mother substrate 10 may be turned over and a subsequent process may be performed.

And with the first electrode 134 of the light emitting device (LED) located on the second assembly wiring 122, the light emitting device (LED) may be bonded to the second assembly wiring 122 by applying heat and pressure to the light emitting device (LED). For example, the first electrode 134 of the light emitting device (LED) may be bonded to the second assembly wiring 122 through eutectic bonding. Eutectic bonding is a bonding method using heat compression at high temperatures and is one of the bonding processes that is very strong and highly reliable. The eutectic bonding method not only realizes high bonding strength, but also has the advantage of eliminating the need to apply a separate adhesive from the outside. However, the bonding method of the plurality of light emitting devices (LEDs) may be configured in various ways other than eutectic bonding, but is not limited thereto.

Meanwhile, different voltages are applied to the plurality of first assembly wirings 121 and the plurality of second assembly wirings 122 when manufacturing the display device 100, but the same voltage is applied when driving the display device 100. To this end, when manufacturing the display device 100, the plurality of first assembly wirings 121 and the plurality of second assembly wirings 122 may be connected to different assembly pads PD and different voltages may be applied.

In this regard, referring to FIG. 4*c*, when manufacturing the display device 100, in the state of the mother substrate 10, the assembly wiring 120 on the plurality of substrates 110 may be connected to the assembly pad PD outside the plurality of substrates 110. Specifically, a plurality of substrates 110 forming the display device 100, a plurality of assembly pads PD and a plurality of assembly wiring connection parts PL may be disposed on the mother substrate 10.

The plurality of assembly pads PD are pads for applying voltage to the plurality of assembly wirings 120, may be electrically connected to a plurality of assembly wirings 120 disposed on each of the plurality of substrates 110 forming the mother substrate 10. A plurality of assembly pads (PD) may be formed on the mother substrate 10 outside the substrate 110 of the display device 100, when the manufacturing process of the display device 100 is completed, the display device 100 may be separated from the substrate 110. For example, when two substrates 110 are formed on the mother substrate 10, a plurality of first assembly wires 121 disposed on each substrate 110 may be connected to one assembly pad PD, and a plurality of second assembly wires 122 may be connected to another assembly pad PD.

Therefore, after placing the mother substrate 10 in the chamber (CB) into which a plurality of light emitting devices (LEDs) are inserted, an electric field may be formed by applying an alternating voltage to a plurality of assembly wirings 120 through a plurality of assembly pads PD, and a plurality of light emitting devices (LEDs) may be easily self-assembled into the plurality of openings (OP) of the first planarization layer 117.

On the other hand, when self-assembling a plurality of light-emitting devices (LEDs) for each sub-pixel (SP), a plurality of assembly wirings 120 arranged in a plurality of red sub-pixels (SPR), a plurality of assembly wirings 120 arranged in a plurality of green sub-pixels (SPG), and a plurality of assembly wires 120 arranged in a plurality of blue sub-pixels (SPB) may be connected to different assembly pads (PD).

In this case, the plurality of assembly pads PD include a first assembly pad (PD1), a second assembly pad (PD2), a third assembly pad (PD3), a fourth assembly pad (PD4), a fifth assembly pad. (PD5) and a sixth assembly pad (PD6).

The first assembly pad PD1 is a pad for applying voltage to the plurality of first assembly wirings 121 disposed in the plurality of red sub-pixels (SPR) on the mother substrate 10. The fourth assembly pad PD4 is a pad for applying voltage to the plurality of second assembly wirings 122 disposed in the plurality of red sub-pixels SPR on the mother substrate 10.

The second assembly pad PD2 is a pad for applying voltage to the plurality of first assembly wirings 121 disposed in the plurality of green sub-pixels (SPG) on the mother substrate 10. The fifth assembly pad PD5 is a pad for applying voltage to the plurality of second assembly wirings 122 disposed in the plurality of green sub-pixels (SPG) on the mother substrate 10.

The third assembly pad PD3 is a pad for applying voltage to the plurality of first assembly wirings 121 disposed in the plurality of blue sub-pixels (SPB) on the mother substrate 10. The sixth assembly pad PD6 is a pad for applying voltage to the plurality of second assembly wirings 122 disposed in the plurality of blue sub-pixels SPB on the mother substrate 10.

Through these plurality of assembly pads (PD), the light emitting device (LED) may be selectively self-assembled only in a specific sub-pixel (SP) among the plurality of sub-pixels (SP). For example, when self-assembling a light emitting device (LED) only in a plurality of red sub-pixels (SPR), through the first assembly pad (PD1) and the fourth assembly pad (PD4), voltage may be applied only to the plurality of first assembly wirings 121 and the plurality of second assembly wirings 122 disposed in the plurality of red sub-pixels (SPR).

The assembly wiring connecting portion PL is a wiring connecting the plurality of assembly wirings 120 and the plurality of assembly pads PD on each substrate 110. One end of the assembly wiring connection portion (PL) is connected to a plurality of assembly pads (PD), and the other end may extend onto the plurality of substrates 110 and be electrically connected to the plurality of first assembly wirings 121 and the plurality of second assembly wirings 122. The assembly wiring connection part PL includes a first connection part PL1, a second connection part PL2, a third connection part PL3, a fourth connection part PL4, a fifth connection part PL5, and a sixth connection part PL6.

The first connection part PL1 is a wire that electrically connects the first assembly wire 121 disposed in the plurality of red sub-pixels SPR on the mother substrate 10 and the first assembly pad PD1. The fourth connection part PL4 is a wire that electrically connects the second assembly wire 122 and the fourth assembly pad PD4 disposed in the plurality of red sub-pixels SPR on the mother substrate 10. For example, the other end of the first connection part PL1 extends to each of the plurality of substrates 110, and may be electrically connected to a plurality of first assembly wirings 121 disposed in each red sub-pixel (SPR) of the plurality of substrates 110. For example, the other end of the fourth connection portion PL4 extends to each of the plurality of substrates 110, may be electrically connected to a plurality of second assembly lines 122 disposed in each red sub-pixel (SPR) of the plurality of substrates 110.

The second connection part PL2 is a wire that electrically connects the first assembly wire 121 and the second assembly pad PD2 disposed in the plurality of green sub-pixels (SPG) on the mother substrate 10. The fifth connection portion PL5 is a wiring that electrically connects the second assembly wiring 122 and the fifth assembly pad PD5 disposed in the plurality of green sub-pixels SPG on the mother substrate 10.

The third connection part PL3 is a wire that electrically connects the first assembly wire 121 and the third assembly pad PD3 disposed in the plurality of blue sub-pixels SPB on the mother substrate 10. The sixth connection portion PL6 is a wiring that electrically connects the second assembly wiring 122 and the sixth assembly pad PD6 disposed in the plurality of blue sub-pixels SPB on the mother substrate 10.

At this time, the plurality of first assembly wirings 121 arranged on one substrate 110 are connected into one, and the plurality of second assembly wirings 122 may also be connected into one, so that each of the plurality of first assembly wirings 121 and the plurality of second assembly wirings 122 may be easily connected to the assembly wiring connection portion PL.

The assembly wiring connection portion (PL) and assembly pad (PD) shown in FIG. 4C are exemplary, it may vary depending on the arrangement and shape of the assembly wiring connector (PL) and assembly pad (PD), the number or sequence of self-assembly processes, and the design of the plurality of sub-pixels (SP).

In the display device 100 according to the embodiment, at least some of the plurality of assembly wirings 120 for self-assembly of the plurality of light emitting devices (LEDs) may be used as wiring for applying a low-potential power supply voltage to the plurality of light emitting devices (LEDs). When manufacturing the display device 100, a plurality of light emitting devices (LEDs) floating in the fluid WT may be moved adjacent to the mother substrate 10 using a magnetic field.

Then, different voltages may be applied to the plurality of first assembly wirings 121 and the plurality of second assembly wirings 122 to form an electric field, and a plurality of light emitting devices (LEDs) may be self-assembled within a plurality of openings (OP) by an electric field. At this time, instead of separately forming a wiring that supplies a low-potential voltage and connecting it to a plurality of self-assembled light emitting devices (LEDs), by bonding the first electrode 134 of the light emitting device (LED) to the second assembly wiring 122, a portion of which is exposed within the opening OP, when driving the display device 100, a plurality of assembly wirings 120 may be used as wiring for supplying low-potential voltage to a plurality of light emitting devices (LEDs).

Therefore, in the display device 100 according to the embodiment, there is a technical effect in that the plurality of assembly wirings 120 may be used not only for self-assembly of the plurality of light emitting devices (LEDs) but also as wiring for driving the plurality of light emitting devices (LEDs).

After the self-assembly process of the light emitting device (LED) shown in FIGS. 4A to 4C, in the step of forming the second planarization layer 118 and the pixel electrode (PE), the second planarization layer 118 is stacked on the first planarization layer 117, and is placed in close contact with only one side of the light emitting device (LED). Accordingly, since the second planarization layer 118 is not disposed on the other side of the light emitting device (LED), a spaced space is created between the other side of the light emitting device (LED) and the first planarization layer 117. The first opening OP1 may be disposed continuously on the first planarization layer 117 and the second planarization layer 118, including the spaced apart space.

The pixel electrode (PE) is formed on the second planarization layer 118 through a sputtering process. At this time, due to the high level difference between the arrangement position of the first opening OP1 and the second planarization layer 118 formed on the first planarization layer 117, a hole H1 overlapping the first opening OP1 is formed in the pixel electrode PE. Therefore, in the area extending from the top of the inner wall of the second planarization layer 118 disposed on the light emitting device (LED) to the hole H1, a contact portion Ca in which the pixel electrode PE is disposed may be formed to contact the second electrode 135 of the light emitting device LED.

After the pixel electrode (PE) is formed, the black matrix (BM) and the protective layer 119 shown in FIG. 3 are formed. Since the protective layer 119 is disposed not only on the black matrix BM but also on the third passivation layer 116 exposed by the first opening OP1, so that the upper part of the light emitting device (LED) and the pixel electrode (PE) exposed by the first opening (OP1) is flattened.

In the case of a display device using a vertical light emitting device, it is necessary to form a contact portion that electrically connects the second electrode of the light emitting device to the connection electrode through the pixel electrode. In a conventional display device, a planarization layer is formed on the entire upper part of the light-emitting device, and then a hole smaller than the metal region disposed at the highest position among the regions of the second electrode of the light-emitting device is formed through a photo process to complete the contact portion. However, the size of these small holes made it difficult to form the holes because the process margin was quite large.

Accordingly, in the display device 100 according to the embodiment, instead of arranging the first opening OP1 only inside the second electrode 135 of the light emitting device LED, the first opening OP1 is disposed to overlap a portion of the second electrode 135 while including a space where the other side of the light emitting device (LED) and the first planarization layer 117 are spaced apart, so that the contact portion Ca formed in the first opening OP1 may be formed with a larger area than before.

At this time, when forming the pixel electrode (PE), a hole (H1) may be formed adjacent to the contact portion (Ca) by an area of the first opening (OP1) opened by the first planarization layer 117. Therefore, in the display device 100 according to an embodiment of the present invention, the hole H1 is formed in the pixel electrode PE due to the arrangement of the second planarization layer 118 and the pixel electrode PE, and the contact portion Ca may be formed in various sizes larger than before, there is a technical effect that may minimize the process margin of the pixel electrode (PE).

Additionally, as the contact portion Ca is easily formed, the reliability of a high-resolution display device using a micro light emitting device (LED) may be improved. Meanwhile, instead of disposing the second planarization layer 118 on both ends of the light emitting device (LED), the second planarization layer 118 and the protective layer 119 are disposed on each end of the light emitting device (LED), there is a technical effect that may prevent the light emitting device from being separated.

FIG. 5 is a cross-sectional view of a display device according to a second embodiment. The second embodiment may adopt the features of the first embodiment. For example, when forming the pixel electrode PE, a hole H1 may be formed adjacent to the contact portion by an area of the first opening OP1 opened by the first planarization layer 217.

Referring to FIG. 5, the first planarization layer 217 is arranged in a reverse tapered shape, and may form a first opening OP1 and a second opening OP2, which are areas between the plurality of light emitting devices LED and the first planarization layer 217. Compared to the display device 100 of FIG. 3, the horizontal separation distance between the end of the upper part of the first planarization layer 217 and the light emitting device 130 may be narrower.

The second planarization layer 118 is stacked on the first planarization layer 217, and is placed in close contact with only a portion of the light emitting device (LED). Specifically, the second planarization layer 118 does not overlap the first opening OP1, but overlaps the second opening OP2, and is disposed to contact one side of the light emitting device LED adjacent to the second opening OP2.

The pixel electrode PE is formed on the second planarization layer 118 through a sputtering process without the second planarization layer 118 being disposed in the first opening OP1. At this time, by the light-emitting device (LED) adjacent to the first opening (OP1) and the first planarization layer 217 having a high step and inverse taper shape of the second planarization layer 118 adjacent to the first opening (OP1), the pixel electrode PE fails to extend from the first planarization layer 217 to the light emitting device 130 and forms a hole H1 in an area overlapping with the first opening OP1.

In the display device 200 according to the second embodiment, since the first planarization layer 217 is arranged in an inverse taper shape, it is easy to form the hole H1 when forming the pixel electrode PE. It may be easy to form the contact portion Ca, which overlaps the first opening OP1 and is an area between the inner wall of the second planarization layer 118 and the hole H1. In addition, since the contact portion (Ca) may be formed in various sizes larger than before, there is a technical effect that may improve the reliability of high-resolution display devices using micro light-emitting devices by minimizing the process margin of the pixel electrode (PE).

FIG. 6 is a cross-sectional view of a display device according to a third embodiment. The third embodiment of FIG. 6 may adopt the features of the first and second embodiments. For example, when forming the pixel electrode PE, a hole H1 may be formed adjacent to the contact portion by an area of the first opening OP1 opened by the first planarization layer 217.

Referring to FIG. 6, an insulating layer 360 may be additionally disposed between the first planarization layer 217 and the light emitting device 130. Specifically, when forming the pixel electrode (PE), the pixel electrode (PE) moves down the side of the light emitting device 130 and is formed to the bottom where the first electrode 134 is disposed to minimize the probability of a short circuit. The insulating layer 360 may be disposed to completely cover the side surface of the first electrode 134.

In the display device 300 according to the third embodiment, the insulating layer 360 is disposed to cover the side of the first electrode 134 of the light emitting device, while preventing a short circuit from occurring due to contact between the pixel electrode (PE) and the first electrode 134, it is possible to form the contact portion (Ca) in various sizes larger than before. Accordingly, the process margin of the pixel electrode (PE) may be minimized, which has the technical effect of improving the reliability of a high-resolution display device using a micro light-emitting device.

FIG. 7 is a cross-sectional view of a display device according to the fourth embodiment. The features of the first embodiment of FIG. 7 may be adopted, and the differences between the contact portion and the hole will be described below.

In the display device 400 according to the fourth embodiment, although not shown in FIG. 7, the first opening OP1 is disposed in a wider area compared to FIG. 2, the inner wall of the first opening (OP1) disposed on one side of the light emitting device (LED) and the contact portion Cb between the holes H2 disposed in the pixel electrode PE may be formed to be wider than the contact portion Ca in FIG. 2. Accordingly, the hole H2 adjacent to one side of the concave portion of the contact portion Cb may also be arranged to be larger in size than the hole H1 in FIG. 2.

In the display device 400 according to the fourth embodiment, the area of the contact portion Cb including the concave portion where the second electrode 135 of the light emitting device (LED) and the pixel electrode (PE) contact may be widened, and the size of the hole H2 adjacent to the contact portion Cb may also be increased. Accordingly, it is possible to form the contact portion Cb in various larger sizes. Additionally, the process margin of the pixel electrode (PE) may be minimized, and the reliability of a high-resolution display device using a micro light-emitting device may be improved.

FIG. 8 is a cross-sectional view of the display device 500 according to the fifth embodiment. The fifth embodiment may adopt the features of the first to third embodiments. For example, when forming the pixel electrode (PE), a hole (H1) may be formed adjacent to the contact portion by an area of the first opening (OP1) opened by the first planarization layer 117, so that the contact part may be formed in a larger size than before, and there is a technical effect of minimizing the process margin of the pixel electrode (PE). Hereinafter, the description will focus on the reflective layer 170.

The display device 500 according to the fifth embodiment may include a reflective layer 170 disposed on a side of the second planarization layer 117 that exposes the area where the light-emitting device 170 will be disposed.

The reflective layer 170 may be placed lower than the pixel electrode (PE) and may not be in contact with the pixel electrode (PE). The reflective layer 170 is formed of a material capable of reflecting light generated from the light emitting device 130, for example, copper (Cu), aluminum (Al), molybdenum (Mo), nickel (Ni), titanium (Ti), chromium (Cr), or an alloy thereof, but is not limited thereto.

Alternatively, the pixel electrode PE and the first electrode 134 may be in contact with each other without being short-circuited with the second clad layer 122*b*, and may be formed of a material that reflects light and has insulating properties to prevent short-circuiting.

Accordingly, the reflective layer 170 is disposed on the inclined surface of the second planarization layer 117, which has the technical effect of improving light extraction efficiency to the front part of the display device 500.

FIG. 9 is a cross-sectional view of the display device 600 according to the sixth embodiment. The sixth embodiment may adopt the features of the first to fifth embodiments. For example, when forming the pixel electrode (PE), a hole (H1) may be formed adjacent to the contact portion by an area of the first opening (OP1) opened by the first planarization layer 117, so that the contact part may be formed in a larger size than before, and there is a technical effect of minimizing the process margin of the pixel electrode (PE). Hereinafter, the description will focus on the characteristics of the assembly wiring 320.

Referring to FIG. 9, the first clad layer 321*b* of the first assembly wiring 321 may extend from the first conductive layer 321*a* toward the second assembly wiring 322. Additionally, the second clad layer 322*b* of the second assembly wiring may extend from the second conductive layer 322*a* toward the first assembly wiring 321.

In the eighth embodiment, the first clad layer 321*b* and the second clad layer 322*b* are disposed with the third passivation layer 116 between them, so that they may overlap top and bottom.

Meanwhile, the second clad layer 322*b* may have a predetermined electrode hole 323 in an area overlapping with the light emitting device 130 and the first clad layer 321*b*. The width of the electrode hole 323 may be smaller than the width of the light emitting device 130.

Additionally, an alternating current voltage may be applied to the first clad layer 321*b* and the second clad layer 322*b* to generate an electric field.

The DEP force caused by this electric field may be concentrated in the electrode hole 323 provided in the second clad layer 322*b*.

The light emitting device 130 may be self-assembled within the openings OP1 and OP2 by concentrated dielectrophoresis force (DEP force).

There is a technical effect of strengthening the assembly force for the light emitting device 130 due to the vertical overlap of the assembly wirings 321 and 322. In addition, the openings OP1 and OP2 do not vertically overlap the first conductive layer 321*a* and the second conductive layer 322*a*, which has the technical effect of reducing the thickness of the panel.

Meanwhile, the second clad layer 322*b* may be disposed below the light emitting device 130. Additionally, the second clad layer 322*b* may be in contact with the first electrode 134 of the light emitting device 130.

Therefore, as the second clad layer 322*b* is disposed on the lower surface of the first electrode 134 of the light emitting device 130, The light-emitting elements 130 are supported uniformly and have a wide electrical contact area between them, thereby improving carrier injection efficiency, resulting in a complex technical effect of improving luminous efficiency and brightness.

Next, FIG. 10 is a diagram showing the assembly wiring 320 in detail in the display device 600 of the sixth embodiment.

Referring to FIG. 10, in the sixth embodiment, a portion of the first clad layer 321*b* and a portion of the second clad layer 322*b* may overlap top and bottom. For example, the first clad layer 321*b* may include a first-first clad layer 321*b*1, a first-second clad layer 321*b*2, and a first-third clad layer 321*b*3. The first-second clad layer 321*b*2 may be a protruding electrode extending from the first-first clad layer 321*b*1 toward the second clad layer 322*b*.

Additionally, the second clad layer 322*b* may include a second-first clad layer 322*b*1, a second-second clad layer 322*b*2, and a second-third clad layer 322*b*3. The second-second clad layer 322*b*2 may be a protruding electrode extending from the second-first clad layer 322*b*1 toward the first clad layer 321*b*.

At this time, the first-second clad layer 321*b*2 and the second-second clad layer 322*b*2 may overlap vertically.

Additionally, the second-second clad layer 322*b*2 may include an electrode hole 323. Accordingly, the DEP force may be concentrated and formed in the electrode hole 323 of the second clad layer 322*b*, and the Dep force is uniformly distributed in the assembly hole 323, which has the technical effect of improving the assembly force. Additionally, the second-third clad layer 322*b*3 connecting the second-first clad layer 322*b*1 and the second-second clad layer 322*b*2 may be arranged to have an inclined surface. Through this, the second conductive layer 322*a* is disposed in areas other than the openings OP1 and OP2, which has the technical effect of reducing the thickness of the panel.

FIG. 11 is a cross-sectional view of a display device according to the seventh embodiment. The seventh embodiment may adopt the features of the first to sixth embodiments. For example, when forming the pixel electrode (PE), a hole (H1) may be formed adjacent to the contact portion by an area of the first opening (OP1) opened by the first planarization layer 117, so that the contact part may be formed in a larger size than before, and there is a technical effect of minimizing the process margin of the pixel electrode (PE). Hereinafter, the description will focus on the characteristics of the second insulating layer 160.

Referring to FIG. 11, the second insulating layer 160 may be additionally disposed between the first planarization layer 117 and the light emitting device. Specifically, the second insulating layer 160 may be disposed from the bottom of the opening to the same height as the light emitting device. Accordingly, it is possible to prevent a short circuit from occurring when the pixel electrode PE contacts the first electrode 134, and it is possible to prevent a short circuit from occurring when a plurality of pixel electrodes contact each other. In addition, since the contact portion (Ca) may be formed in various sizes larger than before, the process margin of the pixel electrode (PE) may be minimized, there is a technical effect that may improve the reliability of high-resolution display devices using micro light-emitting devices.

In the display device including the semiconductor light emitting device according to the embodiment described above by arranging the planarization layer so that the contact part where the pixel electrode and the light emitting device are in contact is formed in an area biased to one side rather than in the center of the area where the light emitting device is placed, there is a technical effect in that the contact part may be formed in various ways.

In addition, the embodiment has the technical effect of providing a high-resolution display device using a micro light-emitting device by minimizing the process margin of the pixel electrode on the light-emitting device.

In addition, the embodiment has the technical effect of minimizing the occurrence of defects due to separation of the light emitting device by the arrangement of the planarization layer and the protective layer.

Additionally, the embodiment has the technical effect of minimizing short-circuit defects in a plurality of light-emitting devices.

In addition, the embodiment may minimize the process margin of the pixel electrode (PE), which has the technical effect of improving the reliability of a high-resolution display device using a micro light-emitting device.

In addition, the embodiment has the technical effect of reducing the thickness of the panel because the assembly hole and the conductive layer do not overlap.

In addition, the embodiment has the technical effect of improving the assembly force for the light-emitting device through vertical overlap of the assembly wiring.

Additionally, the embodiment has the technical effect of improving light extraction efficiency by using a reflective layer.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

EXPLANATION OF CITED REFERENCES

10: substrate AA: Display area NA: Non-display area
SP: Sub-pixel SPR: Red sub-pixel SPG: Green sub-pixel
SPB: Blue sub-pixel 100, 200, 300, 400, 500, 600: Display device
110: Substrate 111: Buffer layer 112: Gate insulating layer 113: First passivation layer
114: Overcoating layer 115: Second passivation layer 116: Third passivation layer
117, 217: first planarization layer 118: second planarization layer 119: protective layer
OP: Opening OP1: First opening OP2: Second opening CH: Contact hole
170: Reflective layer 120, 320: Assembly wiring 121, 321: First assembly wiring
121*a*, 321*a*: first conductive layer 121*b*, 321*b*: first clad layer
122, 322: second assembly wiring 122*a*, 322*a*: second conductive layer
122*b*, 322*b*: second clad layer 321*b*1: first-first clad layer 321*b*2: first-second clad layer
321*b*3: first-third clad layer 322*b*1: second-first clad layer 322*b*2: second-second clad layer
322*b*3: second-third clad layer 323: electrode hole LED: light emitting device 130: red light emitting device
131: first semiconductor layer 132: light emitting layer 133: second semiconductor layer 134: first electrode
135: Second electrode 140: Green light-emitting device 150: Blue light-emitting device
160: Second insulating layer 360: Insulating layer Ca, Cb: Contact portion
H1, H2: Hole SL: Scan wiring DL: Data wiring RL: Reference wiring
VDD: High potential power wiring VDD1: First layer VDD2: Second layer
VDD3: third layer TR1: first transistor ACT1: first active layer
GE1: first gate electrode SE1: first source electrode DE1: first drain electrode
TR2: second transistor ACT2: second active layer GE2: second gate electrode
SE2: second source electrode DE2: second drain electrode TR3: third transistor
ACT3: third active layer GE3: third gate electrode SE3: third source electrode
DE3: Third drain electrode ST: Storage capacitor ST1: First capacitor electrode
ST2: Second capacitor electrode CE: Connection electrode CE1: First connection layer CE2: Second connection layer
PE: Pixel electrode BM: Black matrix CB: Chamber WT: Fluid MG: Magnet
PD: Assembly pad PD1: First assembly pad PD2: Second assembly pad PD3: Third assembly pad
PD4: Fourth assembly pad PD5: Fifth assembly pad PD6: Sixth assembly pad
PL: assembly wiring connection PL1: first connection PL2: second connection
PL3: Third connection PLA: Fourth connection PL5: Fifth connection PL6: Sixth connection

INDUSTRIAL APPLICABILITY

The embodiment may be adopted in the field of displays that display images or information.

The embodiment may be adopted in the field of displays that display images or information using semiconductor light-emitting devices.

The embodiment may be adopted in the field of displays that display images or information using micro- or nano-level semiconductor light-emitting devices.

The invention claimed is:

1. A display device including a semiconductor light emitting device, the display device comprising:
a substrate;
a first assembly wiring and a second assembly wiring alternately arranged on the substrate and spaced apart from each other;
a planarization layer disposed on the first assembly wiring and the second assembly wiring and having a plurality of openings and a plurality of contact portions;
the semiconductor light emitting device including a first electrode and a second electrode disposed inside the plurality of openings, the first electrode overlapping the first assembly wiring and the second assembly wiring; and
a plurality of pixel electrodes disposed on the planarization layer and in contact with the second electrode of the semiconductor light emitting device through the plurality of contact portions,
wherein the plurality of contact portions overlap with a portion of at least one side of an area where the semiconductor light emitting device is disposed,
wherein the planarization layer comprises a first planarization layer disposed on the first assembly wiring and the second assembly wiring, and a second planarization layer disposed on the first planarization layer,
wherein the plurality of openings comprise a first opening disposed in the first planarization layer and the second planarization layer and overlapping a portion of the plurality of contact portions and the first assembly wiring, and a second opening disposed in the first planarization layer and overlapping a portion of the second assembly wiring, and
wherein the first opening overlaps a plurality of holes disposed in the plurality of pixel electrodes.

2. The display device including the semiconductor light emitting device according to claim 1,
wherein the second planarization layer is in contact with a portion of the second assembly wiring and one end of the second electrode, and
wherein the other end of the second electrode is in contact with the plurality of pixel electrodes.

3. The display device including the semiconductor light emitting device according to claim 1, wherein the plurality of contact portions comprise inclined portions and concave portions formed along three sides along an inner wall of the second planarization layer.

4. The display device including the semiconductor light emitting device according to claim 1, further comprising a protective layer disposed on the plurality of pixel electrodes and the second planarization layer, wherein one side of the semiconductor light emitting device is in contact with the second planarization layer, and wherein another side of the semiconductor light emitting device and the plurality of contact portions are configured to be in contact with the protective layer.

5. The display device including the semiconductor light emitting device according to claim 1, wherein the first planarization layer is configured to have a reverse taper shape.

6. The display device including the semiconductor light emitting device according to claim 5, further comprising an insulating layer disposed between the semiconductor light emitting device and the first planarization layer, and wherein the insulating layer is configured to cover an entire side surface of the first electrode.

7. The display device including the semiconductor light emitting device according to claim 1, further comprising a reflective layer in contact with the first planarization layer and disposed inside the plurality of openings.

8. A display device including a semiconductor light emitting device, the display device comprising:

a substrate;

a first assembly wiring and a second assembly wiring alternately arranged on the substrate and spaced apart from each other;

a planarization layer disposed on the first assembly wiring and the second assembly wiring and having a plurality of openings and a plurality of contact portions;

the semiconductor light emitting device including a first electrode and a second electrode disposed inside the plurality of openings, the first electrode overlapping the first assembly wiring and the second assembly wiring; and a plurality of pixel electrodes disposed on the planarization layer and in contact with the second electrode of the semiconductor light emitting device through the plurality of contact portions, wherein the plurality of contact portions overlap with a portion of at least one side of an area where the semiconductor light emitting device is disposed, wherein the first assembly wiring vertically overlaps the second assembly wiring, and wherein the second assembly wiring comprises an electrode hole in a region that vertically overlaps the first assembly wiring.

9. The display device including the semiconductor light emitting device according to claim 8, wherein the first assembly wiring comprises a first conductive layer, and the second assembly wiring comprises a second conductive layer, and wherein the first and second conductive layers are configured not to vertically overlap the plurality of openings.

10. A display device comprising:

a substrate;

an assembly wiring disposed on the substrate;

a light emitting device disposed on the assembly wiring;

a plurality of pixel electrodes disposed on the light emitting device and having a plurality of holes;

a planarization layer disposed on the assembly wiring and overlapping one side of the light emitting device;

a first opening disposed on the other side of the light emitting device; and a second opening disposed on one side of the light emitting device, wherein the plurality of holes are disposed in the first opening.

11. The display device according to claim 10, wherein the plurality of pixel electrodes comprise a plurality of contact portions overlapping the first opening, wherein the plurality of contact portions are composed of an inclined portion and a concave portion, wherein the inclined portion is a region where three sides are connected along an inner wall of the planarization layer, and wherein the concave portion is an area where the light emitting device and the plurality of pixel electrodes come into contact with each other.

12. The display device according to claim 11, wherein the light emitting device includes a first electrode and a second electrode, wherein the first electrode of the light emitting device is in contact with the assembly wiring, wherein the second electrode of the light emitting device is in contact with the plurality of pixel electrodes through the plurality of contact portions, and wherein the plurality of contact portions overlap with a portion of at least one side of an area where the light emitting device is disposed.

13. The display device according to claim 11, wherein the plurality of contact portions are configured to contact the plurality of holes.

14. The display device according to claim 10, wherein the planarization layer comprises a first planarization layer disposed on the assembly wiring and a second planarization layer disposed on the first planarization layer, wherein a protective layer is disposed on the second planarization layer and the plurality of pixel electrodes, wherein the second planarization layer is in contact with one side of the light emitting device, and wherein the protective layer is in contact with the other side of the light emitting device.

15. The display device according to claim 14, wherein the first planarization layer is configured to have a reverse taper shape.

16. The display device according to claim 15, further comprising an insulating layer disposed between the first planarization layer and the light emitting device, wherein the light emitting device includes a first electrode and a second electrode, and wherein the insulating layer is configured to cover an entire side surface of the first electrode.

17. The display device according to claim 14, further comprising a reflective layer in contact with the first planarization layer and disposed inside the first and second openings.

18. The display device according to claim 10, wherein the assembly wiring comprises a first assembly wiring and a second assembly wiring, wherein the first assembly wiring is configured to vertically overlap the second assembly wiring, and wherein the second assembly wiring comprises an electrode hole in a region that vertically overlaps the first assembly wiring.

19. The display device according to claim 18, wherein the first assembly wiring comprises a first conductive layer, wherein the second assembly wiring comprises a second conductive layer, and wherein the first and second conductive layers are configured not to vertically overlap the first and second openings.

* * * * *